US009231609B1

(12) United States Patent  
Petrovic et al.

(10) Patent No.: US 9,231,609 B1  
(45) Date of Patent: Jan. 5, 2016

(54) SYSTEMS AND METHODS FOR FREQUENCY GENERATION

(71) Applicant: Entropic Communications, Inc., San Diego, CA (US)

(72) Inventors: Branislav Petrovic, La Jolla, CA (US); Tommy Yu, Orange, CA (US); Troy Brandon, San Diego, CA (US); Ralph Duncan, Irvine, CA (US)

(73) Assignee: Entropic Communications, LLC., Carlsbad, CA (US)

( * ) Notice: Subject to any disclaimer, the term of this patent is extended or adjusted under 35 U.S.C. 154(b) by 0 days.

(21) Appl. No.: 14/532,935

(22) Filed: Nov. 4, 2014

(51) Int. Cl.
| | | |
|---|---|---|
| *H03M 1/00* | (2006.01) | |
| *H03M 1/12* | (2006.01) | |
| *H03B 5/30* | (2006.01) | |
| *H04H 40/90* | (2008.01) | |
| *H04N 5/445* | (2011.01) | |
| *H04N 5/44* | (2011.01) | |
| *H04N 7/20* | (2006.01) | |

(52) U.S. Cl.
CPC ............... *H03M 1/1245* (2013.01); *H03B 5/30* (2013.01); *H03M 1/00* (2013.01); *H03M 1/12* (2013.01); *H04H 40/90* (2013.01); *H04N 5/4401* (2013.01); *H04N 5/44543* (2013.01); *H04N 7/20* (2013.01)

(58) Field of Classification Search
CPC ...... H03M 1/00; H03M 1/12; H04N 5/44543; H04N 5/4401; H04N 7/20; H04H 40/90
USPC ............ 341/122, 155; 725/39, 72, 68, 69, 67, 725/63, 71
See application file for complete search history.

(56) References Cited

U.S. PATENT DOCUMENTS

| 5,416,799 | A | 5/1995 | Currivan et al. |
|---|---|---|---|
| 6,088,341 | A | 7/2000 | Hinedi et al. |
| 2006/0240793 | A1 | 10/2006 | Andre et al. |
| 2008/0205633 | A1 | 8/2008 | Dyba et al. |
| 2009/0073039 | A1 | 3/2009 | Rideout et al. |
| 2011/0283330 | A1* | 11/2011 | Wang .............................. 725/69 |
| 2012/0027141 | A1 | 2/2012 | Petrovic et al. |
| 2013/0278304 | A1 | 10/2013 | Goldblatt et al. |

OTHER PUBLICATIONS

Wikipedia, the free encyclopedia; Least mean squares filter; Apr. 6, 2011.
Earl R. Ferrara, Jr.; Bernard Widrow; The Time-Sequenced Adaptive Filter; IEEE Transactions on Circuits and Systems, vol. CAS-28, No. 6, Jun. 1981, p. 519-523.

* cited by examiner

*Primary Examiner* — Joseph Lauture
(74) *Attorney, Agent, or Firm* — McAndrews Held & Malloy

(57) ABSTRACT

A dielectric resonator oscillator includes a dielectric resonator; a transmission line disposed adjacent the dielectric resonator; an active device having an input electrically connected to the transmission line; a matching network having an input electrically connected to an output of the active device and an output configured to be connected to a load; wherein both the transmission line and the active device are positioned sufficiently close to the dielectric resonator to form part of a resonant circuit with the dielectric resonator.

22 Claims, 20 Drawing Sheets

SYSTEMS AND METHODS FOR FREQUENCY GENERATION

TECHNICAL FIELD

The disclosed technology relates generally to satellite communications, and more particularly, some embodiments relate to improved signal processing techniques for satellite signals.

DESCRIPTION OF THE RELATED ART

Satellite television and other satellite communications have become mainstream in today's society. For example, satellite dishes and outdoor receiver units are common sights in commercial and residential areas. FIG. 1 is a diagram illustrating a typically outdoor unit. Referring to FIG. 1, a satellite receiver outdoor unit (ODU) 110 typically comprises a dish antenna 150, one or more antenna feed horns 130, one or more low noise amplifier and block down converters (LNB) 140, and an optional multiport cross point switch 160. Dish 150 collects and focuses received signal power onto antenna feed horns 130 which couples the signal to LNBs 140. A single dish 150 may have multiple feed horns 130 wherein each feed receives a signal from a different satellite in orbit. An installation may have more than one dish, feed, and LNB assemblies. The cross point switch 160 allows connection of the outdoor unit 110 to more than one integrated receiver decoder (IRD) 180 located inside the building. IRDs are commonly called set top boxes (STBs) arising from their typical installed location on top of TV sets. The LNB 140 converts the signal transmitted by a satellite in Earth orbit, for example C band, Ku band, or another frequency band, to a lower intermediate frequency (IF) suitable for transmission through coax inside a building. For example, L band IF (950 to 1450 MHZ) with RG-6 or RG-11 coax cable is commonly used. The IRD 180 tunes one transponder channel, demodulates the IF signal from the LNB down to base band, provides channel selection, conditional access, decodes the digital data to produce a video signal, and generates an RF output to drive a television.

A satellite outdoor unit may have as many as three or more LNBs each with two receiving polarizations. The received polarization is selected by sending a voltage or other control signal to the LNB. In this configuration, six possible 500 MHz signals may be selected by the multiport cross point switch to be routed to each IRD. The 500 MHz signal is typically comprised of 16 transponder signals of 24 MHz bandwidth each with a guard band in between each transponder signal. Other transponder bandwidths may be used, such as 36 MHz or 54 MHz (either a single channel or shared by two TV signals) and 43 MHz.

FIG. 2 is a diagram illustrating an example implementation of a low noise block 140. In this example, the low noise block LNB receives horizontally and vertically polarized signals from the satellite. For each polarization, low noise block includes one or more low noise amplifiers (LNA) 141 to amplify the received signal to an acceptable level for processing. Preferably, the amplification may be done as close to the signal source (e.g., the antenna) as possible to avoid amplifying additionally introduce noise. The amplified received signal can be passed through a bandpass filter 142 to filter out unwanted noise from the signal. A down converter 143 can be used to downconvert the received signal to an intermediate frequency or directly to a desired frequency for distribution. In this example, the down converter includes a mixer and a local oscillator at the desired frequency (e.g., 9.75 GHz or 10.6 GHz). The downconverted signal can be further filtered and amplified prior to distribution. This is illustrated by low pass filter (LPF) 144 and amplifier (AMP) 146. Switches 147 can be provided to allow selection and placement of the desired signal onto a selected output. Additional amplifiers 148 can also be provided for distribution of the signals such as, for example, along the cable drop. A switch control module 149 can also be provided to control selection of the matrix which is 147. Switch control, for example, can respond to commands from the set top boxes to ensure delivery of desired program content accordingly.

FIG. 3 is a diagram illustrating another example of a low noise block (LNB) 140. The example illustrated in FIG. 3 in particular is an example of a wideband LNB. Similar to the example illustrated in FIG. 2, this LNB 140 includes low noise amplifiers 141, and pass filters 142, downconverters 143, and low pass filters 144. However, because the example of FIG. 3 is a wideband system, the output for each polarization (horizontal and vertical) or on a single output, which in this instance covers 290-2340 MHz, or approximately 2 GHz in bandwidth.

BRIEF SUMMARY OF EMBODIMENTS

According to various embodiments of the disclosed technology a circuit for frequency sampling using an integrated DRO, includes a first input coupled to receive a first satellite signal at a first satellite downlink frequency; a second input coupled to receive a second satellite signal at a second satellite downlink frequency; a first analog-to-digital converter having an input coupled to receive the first satellite signal and an output, the first analog-to-digital converter configured to operate at a sampling rate at least twice the first satellite downlink frequency, and further configured to create a first digital output signal representing the first satellite signal; a second analog-to-digital converter having an input coupled to receive the second satellite signal and an output, the second analog-to-digital converter configured to operate at a sampling rate at least twice the second satellite downlink frequency, and further configured to create a second digital output representing the second satellite signal; and a dielectric resonator oscillator having an output; and a clock generator circuit having an input coupled to the oscillator output and configured to output one or more clocks used by the first and second analog-to-digital converters; wherein the first analog-to-digital converters are implemented as part of an integrated circuit and a resonator element of the dielectric resonator oscillator is mounted on the substrate of the integrated circuit. In various embodiments, the integrated circuit may include a flip-chip IC, the flip-chip IC comprising a substrate and a die.

In further embodiments, the dielectric resonator oscillator may include: a dielectric resonator; a transmission line disposed on the substrate of the flip chip and extending adjacent the dielectric resonator; and active elements coupled to the transmission line and integrated with the die of the flip chip.

The active elements may include an active device having an input electrically connected to the transmission line; and a matching network having an input electrically connected to an output of the active device and an output configured to be connected to a load.

In some embodiments, the dielectric resonator is mounted on the substrate of the flip-chip IC. In other embodiments, the flip-chip IC is mounted on a printed circuit board and the dielectric resonator is mounted on the printed circuit board adjacent the flip-chip IC. The transmission line may be disposed on the substrate of the flip chip and may extend to the printed circuit board adjacent the dielectric resonator.

In various embodiments, the transmission line or lines may be positioned sufficiently close to the dielectric resonator to form part of a resonant circuit with the dielectric resonator. The clock generator circuit may include at least one of a frequency multiplier and an frequency divider to provide the one or more clocks used by the first and second analog-to-digital converters at frequencies different from that output by the dielectric resonator oscillator.

In further embodiments, a dielectric resonator oscillator may include: a dielectric resonator; one or more transmission lines disposed adjacent the dielectric resonator; an active device having an input electrically connected to the transmission line; and a matching network having an input electrically connected to an output of the active device and an output configured to be connected to a load; wherein both the transmission line and the active device are positioned sufficiently close to the dielectric resonator to form part of a resonant circuit with the dielectric resonator.

In various embodiments, the dielectric resonator may be coupled to the transmission line and the active device without a direct connection. The transmission line may include a microstrip line.

In yet another embodiment, a dielectric resonator oscillator integrated with a flip-chip IC comprising a substrate and a die, the dielectric resonator oscillator may include: a dielectric resonator; a transmission line disposed on the substrate of the flip chip and extending adjacent the dielectric resonator; and an active device integrated with the die of the flip chip and having an input electrically connected to the transmission line; wherein the transmission line is positioned sufficiently close to the dielectric resonator to form part of a resonant circuit with the dielectric resonator. A matching network may be included and may be integrated with the die of the flip chip and have an input electrically connected to an output of the active device and an output configured to be connected to a load.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 6, which comprises

FIG. 7, which comprises

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein are directed toward a devices and methods for providing techniques for improving satellite communications. More particularly, the various embodiments of the technology disclosed herein relate to improved LNB configurations.

Figure 4:
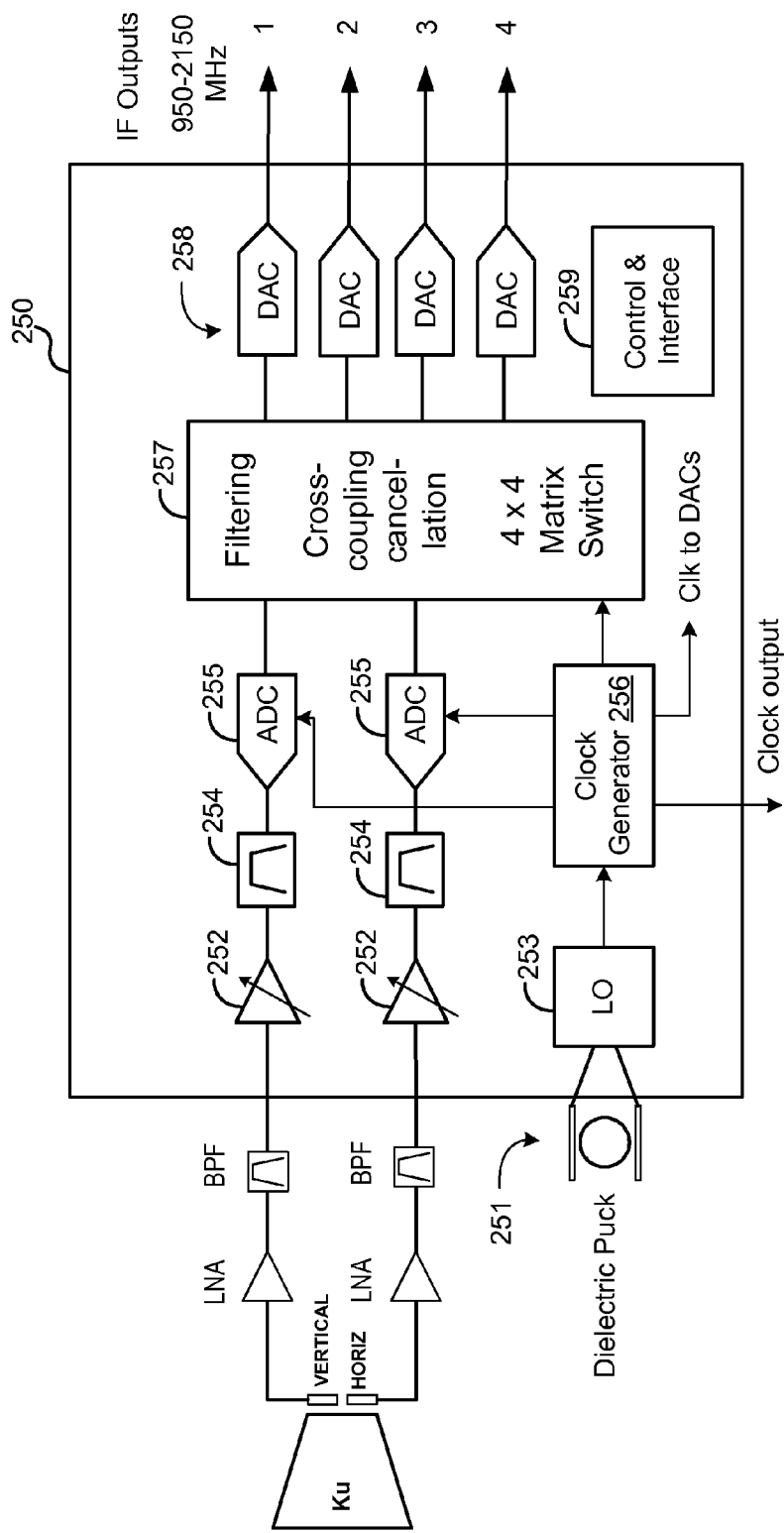
FIG. 4 is a diagram illustrating an example of an LNB in accordance with one embodiment of the technology disclosed herein.

FIG. 4 is a diagram illustrating an example of an LNB in accordance with one embodiment of the technology disclosed herein. The example illustrated in FIG. 4 is one of a single satellite implementation with Vertical and Horizontal polarizations. In this example, the satellite signals are Ku band satellite signals however, the LNB can be configured for use with other satellite bands. This example includes a low noise block (LNB) IC 250 that can be implemented, for example, on a single or multiple integrated circuits. LNB IC 250 in this example includes analog variable gain amplifiers 252, bandpass filters 254, analog-to-digital converters 255, a filtering, cross cancellation and matrix switch module 257, digital-to-analog converters 258, a control and interface module 259, a dielectric puck resonator 251, a local oscillator 253, and a clock generator 256. The LNB can also include low noise amplifiers (LNA) and bandpass filters (BPF), which can be implemented, for example, as LNAs 141 and BPFs 142.

In operation, the amplitude of the incoming signals is adjusted by variable gain amplifiers 252 and unwanted noise outside of the desired frequency bands is removed by bandpass filters 254. The analog signal is sampled by analog-to-digital converters 255 using a clock provided by clock generator 256. The resulting digital signals can be processed by module 257, which can provide further filtering, cross coupling cancellation, and switching to the designated output or outputs. Digital-to-analog converters 258 convert the outputs to digital form for distribution to the set top boxes. LNB 250 can be configured and implemented to perform what is sometimes referred to as channel stacking (CSS) as described in more detail below.

Various features of the technology disclosed herein can be implemented for use in this example LNB as well as in other LNB configurations, as will become apparent to one of ordinary skill in the art after reading this description. For example, various features described in terms of this example LNB IC 250 can be implemented with quad, twin, single, and wideband LNB circuits. For a wideband LNB implementation, rather than four outputs at 950-2150 MHz, the LNB can be implemented with two outputs, each at 290-2340 MHz IF each (each 2.05 GHz wide).

In some embodiments, the dielectric resonator can be implemented in an integrated fashion with the LNB IC. As discussed further below, in some embodiments, the dielectric resonator oscillator, or DRO, can be integrated with the IC package. Consider, for example, the case of a flip chip integrated circuit. In this application, the dielectric puck and associated transmission lines can be mounted on a substrate of the flip chip package all the active components of the DRO can be fabricated as part of the integrated circuit die. Accordingly, the DRO can be configured to consume less real estate, require fewer discrete components (e.g. discrete transistors) and realize a lower production cost. Likewise, the DRO can be implemented to provide a stabilized reference frequency without the need for a PLL.

Another feature that can be implemented in various embodiments are systems and methods for correcting frequency error in the local oscillator. As described below, embodiments can be implemented to profile the incoming transponders spectral shape, or to identify spectral nulls between transponders to determine and maintain the appropriate center frequency in a closed loop. Embodiments can be implemented such that internal filters and the output frequency are digitally corrected, while other embodiments are configured such that the local oscillator can be physically tuned to the correct center frequencies such as through the use of tuned or switched capacitors.

Another feature that can be implemented in various embodiments are systems and methods for cross canceling and removing undesired cross coupling of signals that may occur in the IC. In various embodiments, this can be done on a pin for pin basis such that cross coupling can be reduced or eliminated across adjacent pins or across other pin pairs over which cross coupling may occur. Embodiments can be implemented where the correction occurs on an ongoing basis through the use of power measurement and filter coefficient adjustment. The adjustment can continue until the measured power reaches a relative minimum.

Still another feature that can be implemented in various embodiments is direct on-frequency sampling of the incoming signal at the satellite band, with digital filtering, processing and routing. This can allow, in effect, a direct downconversion and reduce the number of components otherwise required to implement the LNB.

Yet another feature that can be implemented in various embodiments is that of shared analog-to-digital converters. In various embodiments, signals of different frequencies can be combined and sampled using one analog-to-digital converter as opposed to using multiple analog-to-digital converters. Embodiments can be implemented to reduce the number of components required for the LNB IC.

Figure 5:
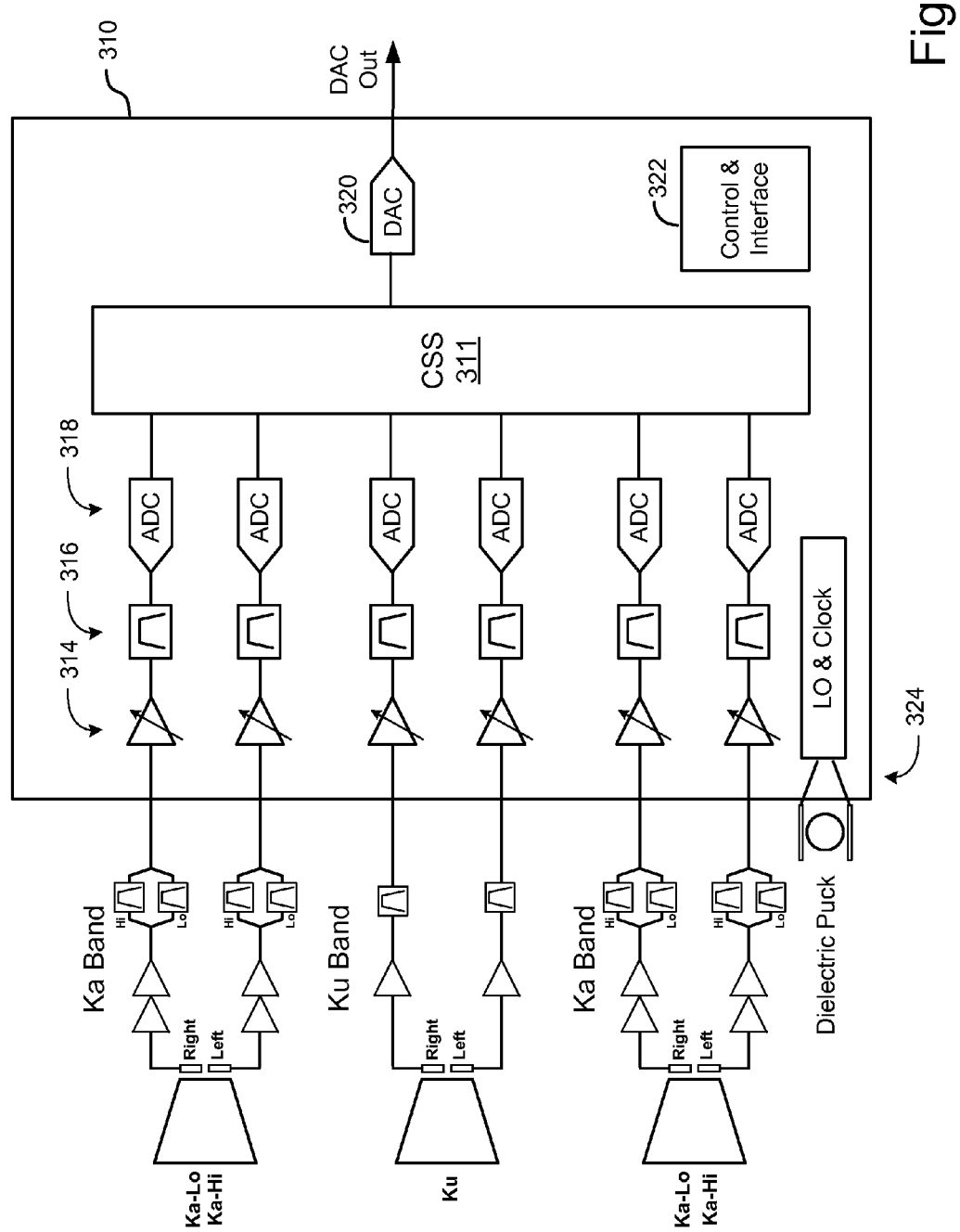
FIG. 5 is a diagram illustrating another example of an LNB, but configured to handle 3 satellites, each having left and right polarizations.

FIG. 5 is a diagram illustrating another example of an LNB, this time configured to handle 3 satellites, each having left and right polarizations. As with the example shown in FIG. 4, this example includes one or more low noise amplifiers and bandpass filters at the front end of the system. In the case of Ka band, two bandpass filters can be used, one each signal to select the high and low bands of the Ka band. The example of FIG. 5 also includes an LNB IC 310. In this example, LNB IC 310 includes variable gain amplifiers 314, bandpass filters 316, and analog-to-digital converters 318, and a digital-to-analog converter 320 at the output. This example also includes a channel stacking switch (CSS) 311, which can be implemented, for example, part of LNB IC 310. Additionally, a control and interface module 322 is included to provide control of CSS 311 and other components of the LNB IC 310. A dielectric puck resonator 324 with the appropriate clock generation circuitry can also be provided. The various features described above that may be included in various embodiments of LNB IC 250 may also be included with LNB IC 310.

Figure 6A:
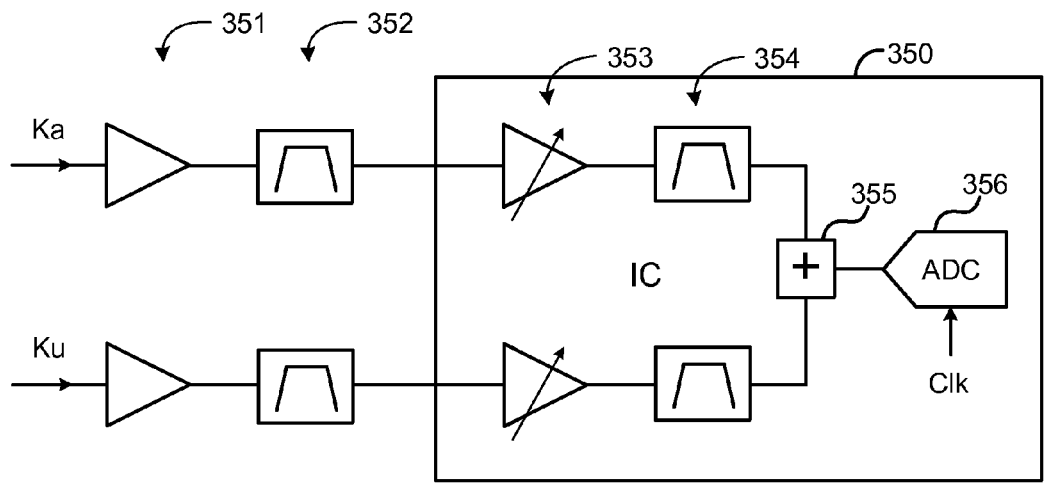
FIGS. 6A and 6B, is a diagram illustrating an example of a shared analog-to-digital converter in accordance with one embodiment of the technology disclosed herein.
Figure 6B:
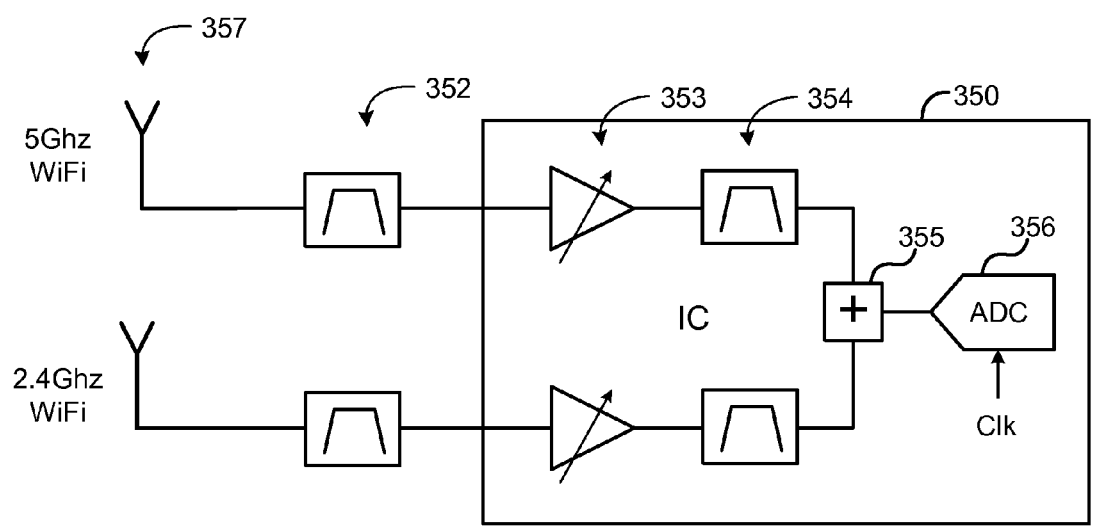

As noted above, in various embodiments systems and methods can be implemented to provide sharing of analog-to-digital converters (e.g. analog-to-digital converters 318 of FIG. 5) in the LNB. Particularly, embodiments can be implemented in which the signals of different frequencies can be combined together and then sampled using a single ADC. The resultant digital representation of the combined signals can then be provided to the CSS (or other processing module) for further processing and handling. FIG. 6, which comprises FIGS. 6A and 6B, is a diagram illustrating an example of a shared analog-to-digital converter in accordance with one embodiment of the technology disclosed herein. The example of FIG. 6A is depicted in terms of two different satellite signals, one at the Ka band and the other at the Ku band. Ka band signals are for example 18.3-18.8 GHz (low band), and 19.7-20.2 GHz (high band), while Ku band signals range from 12.2-12.7 GHz. The example of FIG. 6B is depicted in terms of 2 different WiFi signals, one at 2.4 GHz and the other at 5 GHz. After reading this description, one of ordinary skill in the art will appreciate how the shared analog-to-digital converter techniques can be applied with signals at other frequency bands.

Figure 1:
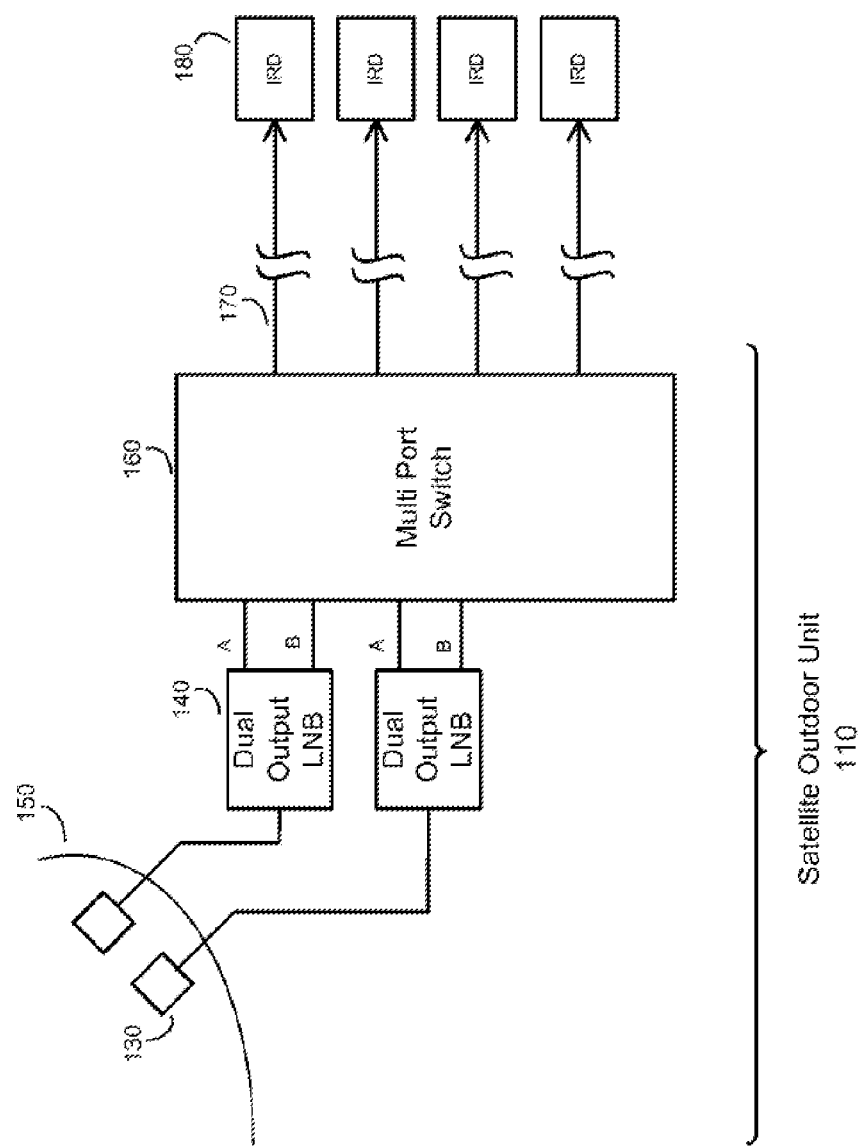
FIG. 1 is a diagram illustrating a typically outdoor unit.
Figure 2:
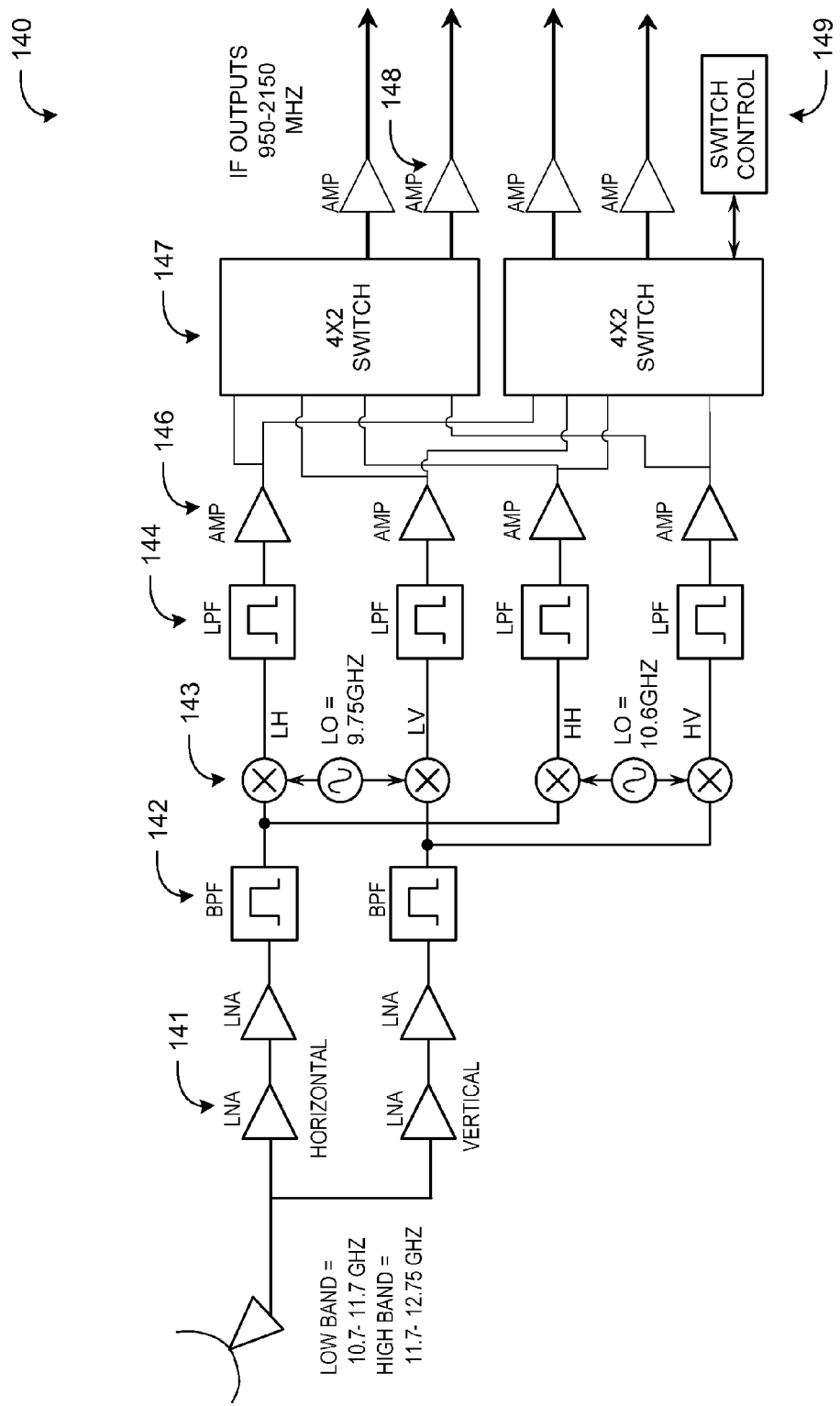
FIG. 2 is a diagram illustrating an example implementation of a low noise block.
Figure 3:
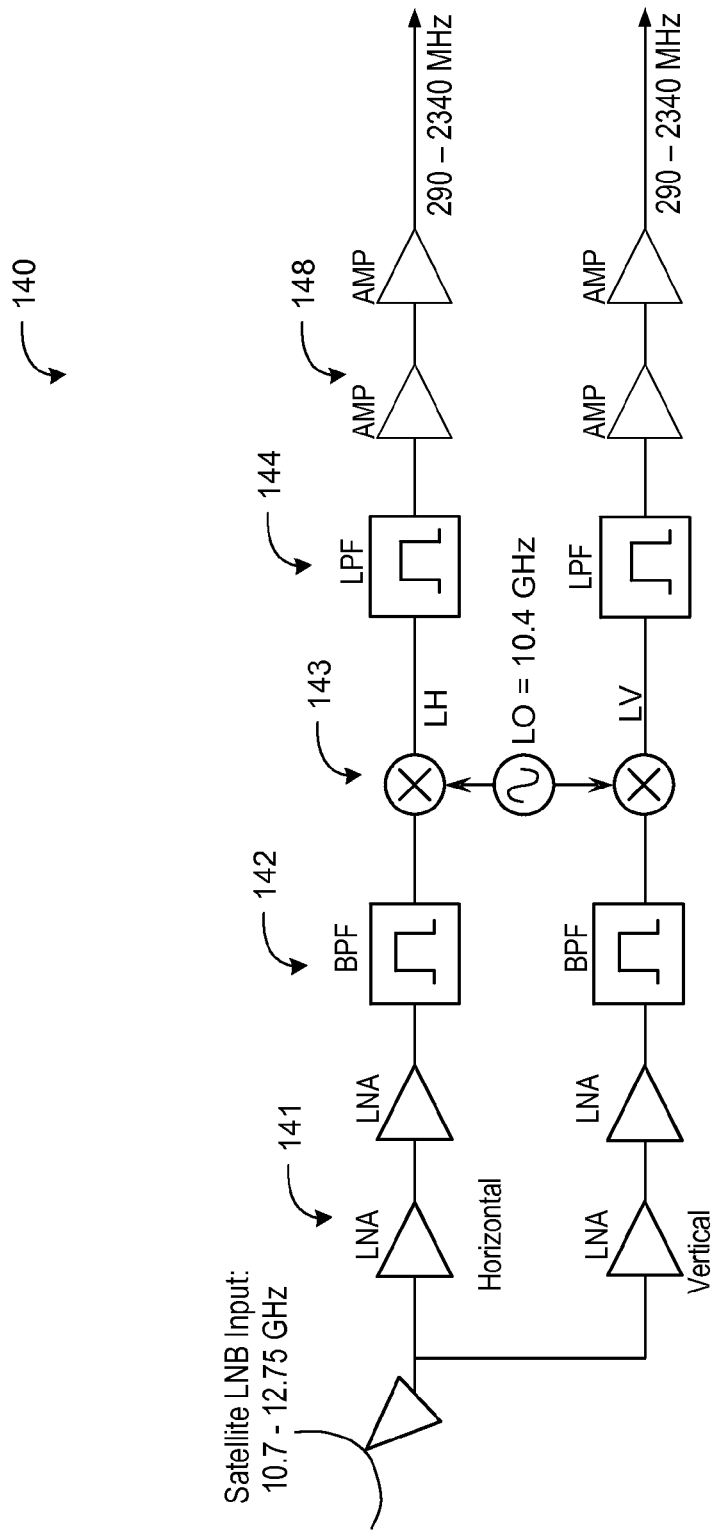
FIG. 3 is a diagram illustrating another example of a low noise block (LNB).

Turning first to FIG. 6A, for illustration purposes, the system is shown as having two low noise amplifiers 351 and two bandpass filters 352. These can, for example, represent the low noise amplifiers and bandpass filters depicted in FIGS. 3 and 4 to the left of the inputs of the LNB ICs. FIG. 6A also depicts a portion of an example LNB IC 350 to illustrate an embodiment of the shared analog-to-digital converter. In this example, LNB IC 350 includes two variable gain amplifiers 353, one for each input signal. LNB IC 350 also includes two bandpass filters 354, one for each input signal. A combiner 355 is provided to combine the two input signals into a single analog signal. The combining can be, for example, a simple spectral combination of signals. The combiner 355 can be implemented as a combiner, passive diplexer, or other device to mix together the two satellite signals. Preferably, the signals chosen for combination are signals having frequencies that do not overlap with one another such that the combination does not provide unwanted interference.

Because the signals are combined, they can be digitized for further processing using a single analog-to-digital converter 356. This is contrasted with conventional solutions in which a separate analog-to-digital converter would have been used for each input signal. The signal combining can be performed on or off chip, but is illustrated on chip in the example of FIG. 6A. An external frequency conversion can be included to handle situations where incoming signals are at the same frequencies. Accordingly, one (or both) of the signals can be converted to a different frequency so that the frequencies of the two signals are non-overlapping, allowing the combination by the combiner. For example, additional feeds at a given band can be downconverted (e.g. externally) to an intermediate frequency and then combined with another feed from the same band for shared sampling. In some embodiments, the sampling clock frequency for the analog-to-digital conversion is selected in between the Ka and the Ku bands. For example, the sampling clock frequency can be selected at 15.85 GHz.

FIG. 6B is a diagram illustrating a similar configuration as in FIG. 6A, but configured for operating at WiFi frequencies. As illustrated in this example, the system is configured to combine signals at two different WiFi frequencies, 2.4 GHz and 5 GHz, and to digitize the combined signal using a single analog-to-digital converter 356. Although two specific bands are shown in this example, the shared analog-to-digital converter can be implemented for combined signals from other multiple WiFi bands including, for example, 3.6 GHz, 6 GHz, and so on.

It is noted that components 352-356 are illustrated using the same reference numerals as the Ka/Ku band implementation, to reflect similar functionality. However, as will be apparent to one of ordinary skill in the art after reading this discussion, these components can be selected and tuned to operate at the corresponding WiFi frequencies. For example, for sampling in different Nyquist zones, the sampling clock frequency can be chosen between the 2.4 GHz and 5 GHz bands (e.g. at ~5 GHz). After sampling, the 2.4 GHz band (which falls into the first Nyquist zone) in the digital domain will remain at 2.4 GHz, while the 5 GHz band (located in the third Nyquist zone) is translated to approximately 0.8 GHz. In another embodiment, the sampling clock frequency can be set at above the 5 GHz band (e.g., at ~6 GHz), in which case, the 2.4 GHz band remains at 2.4 GHz after sampling, while the 5 GHz (now in the second Nyquist zone) is translated to about 0.2 GHz. Internal bandpass filtering 354 can be provided to suppress aliasing of noise on to the desired signal from other Nyquist zones and between the bands. Preferably, in various embodiments, the filters are centered at the WiFi bands of interest. In other embodiments, the internal bandpass filters 354 may be eliminated to simplify the architecture.

Although the examples above in FIGS. 6A and 6B are illustrated in terms of combining two signals, embodiments can be implemented in which two or more signals are combined. In various embodiments, the signals can be level adjusted using, for example, the variable gain amplifier 353 (e.g. automatic gain control) prior to combining. Signal combination can, for example, be direct wired-OR combining such as by using diplexing filters connected to the same point. In other embodiments, the signal combining can be accomplished using a summing circuit. Clock frequencies for sampling can be chosen in various embodiments to place the multiple bands in different Nyquist zones, while in other embodiments the clock frequency can be chosen to place the bands in a first Nyquist zone.

Figure 7A:
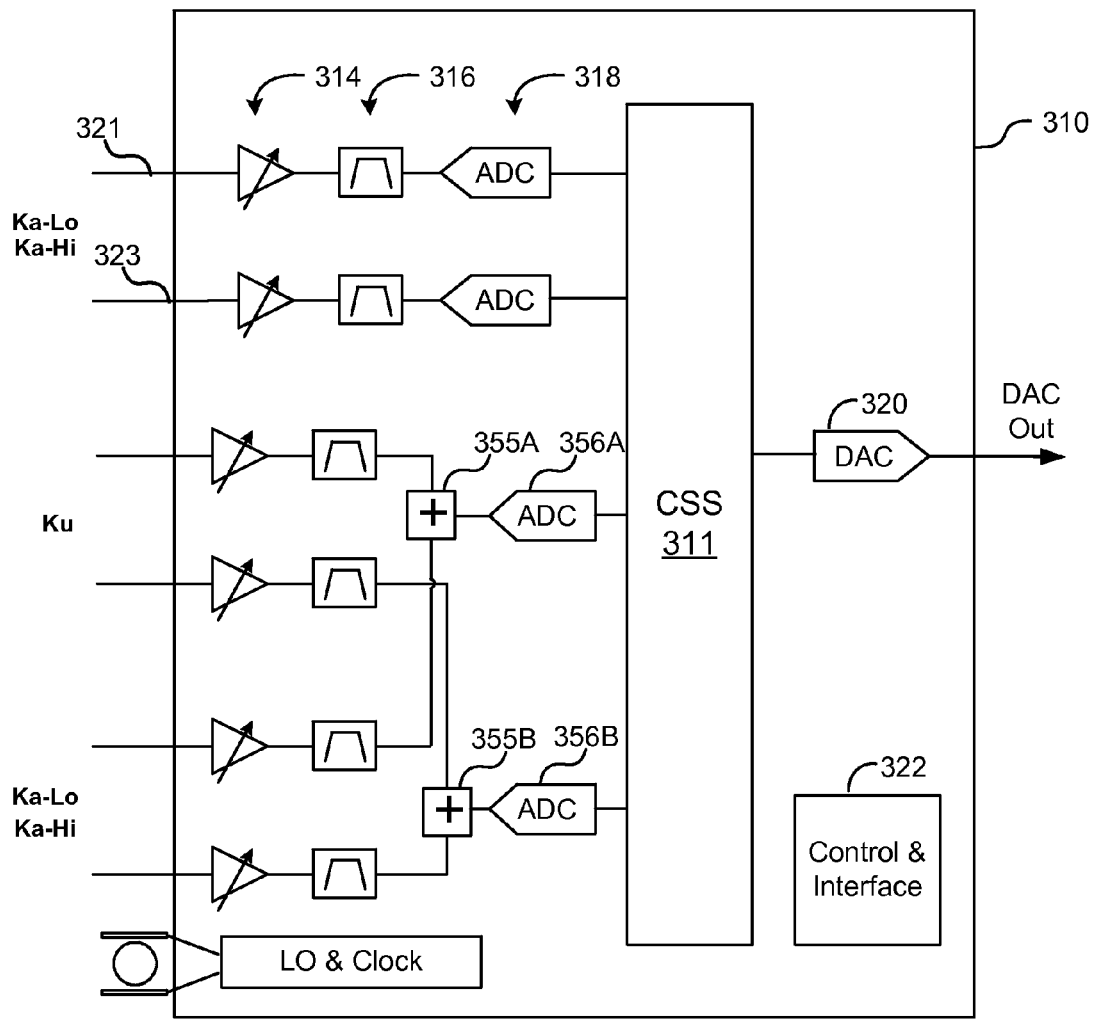
FIGS. 7A and 7B, is a diagram illustrating an example of implementing a combiner with a shared ADC in an LNB IC.
Figure 7B:
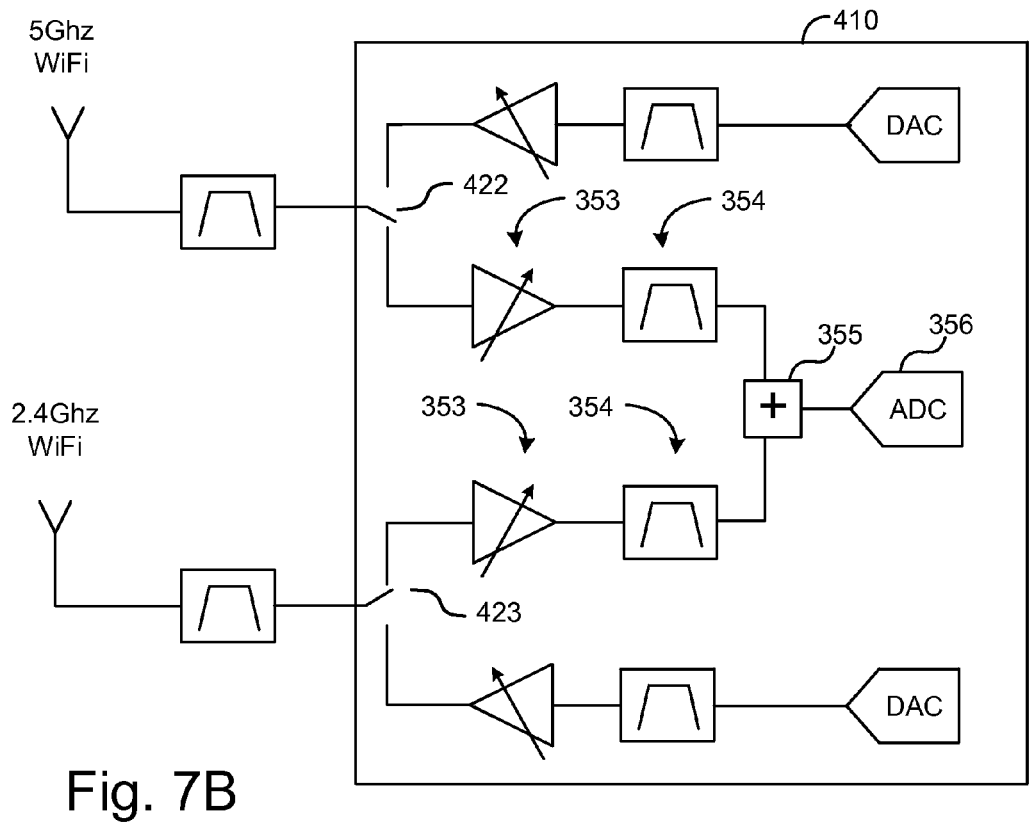

FIG. 7, which comprises FIGS. 7A and 7B, is a diagram illustrating example implementations of a combiner with a shared ADC. An example of implementing a combiner with the shared ADC in an LNB IC is illustrated in FIG. 7A, while an example of implementing a combiner with the shared ADC in a WiFi IC is illustrated in FIG. 7B. Referring now to FIG. 7A, in this example LNB IC 310 still includes signal inputs for three satellites: two at Ka band and one at the Ku band. Because the Ku band and Ka band satellite signals are at different frequencies, they can be combined without any appreciable interference. Accordingly, one polarization of the Ku band signal is combined with one polarization of the Ka band signal at a first combiner 355A, and the combined signal is converted by the first analog-to-digital converter 356A, and the digital signal is provided to the CSS 311. Similarly, the other polarization of the Ku band signal is combined with the other polarization of the Ka band signal at second combiner 355B. The combined signal is likewise digitized by analog-to-digital converter 356B. When compared to the example of FIG. 5, the example of FIG. 7A includes two fewer analog-to-digital converters while only adding to combiners.

As noted above, embodiments can be implemented in which a frequency translation is performed to separate two signals in frequency such that they can be combined with a single analog-to-digital converter. Accordingly, in such embodiments, the implementation of FIG. 7A could be further modified to adjust the frequency of either or both of the Ka band signals 321, 323, and to combine the adjusted signals using a combiner (e.g. like combiner 355) to route the combined signal through a single analog-to-digital converter. For example, in some embodiments, one of the signals can be downconverted to an intermediate frequency prior to being combined.

Referring now to FIG. 7B, in this example a WiFi IC 410 includes signal inputs and outputs for two WiFi frequencies. Those are WiFi frequencies of 5 GHz and 2.4 GHz. Because the signals are at different frequencies, they can be combined on the receive side without any appreciable interference. Accordingly when switches 422, 423 for each band are set to the receive position, signals from both the 5 GHz and 2.4 GHz antennas are routed through the respective variable gain amplifiers 353 and bandpass filters 354, and are combined by combiner 355 so that they can be sampled using a single analog-to-digital converter 356. As noted above, the variable gain amplifiers, bandpass filters, combiners, analog to digital converters and sampling clocks are selected and tuned based on the operating frequencies of the WiFi signals. As this example illustrates, a single analog-to-digital converter can be used to support a multi-band concurrent WiFi architecture. Additionally, greater than two bands can be supported provided the frequencies will not interfere with one another when the signals are combined, or provided that potentially interfering frequencies are translated to a non-interfering frequency prior to combining. Although one antenna for each band is shown in this example, multiple MIMO antennas can be served with a similar architecture repeated for each antenna. For example, in one embodiment, the system can be configured to support a 4×4 MIMO in the 5 GHz band in a 2×2 MIMO in the 2.4 GHz band. As this example serves to illustrate, other MIMO configurations in frequency bands can be supported.

Figure 8:
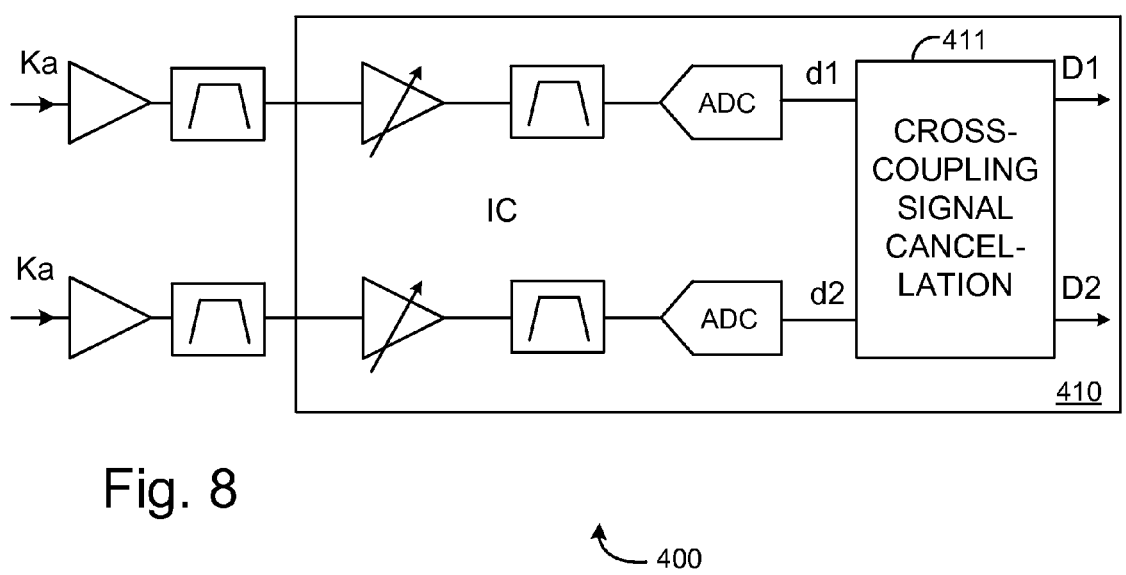
FIG. 8 is a block diagram illustrating an example of cross-coupling signal cancellation in accordance with one embodiment of the technology disclosed herein.

Another feature that can be included in one or more embodiments is signal cancellation to reduce or eliminate cross coupling effects. With high-frequency signal such as those involved in satellite reception and distribution systems cross coupling can occur between adjacent signals. This can occur at numerous places along the downlink path between the satellites and set-top boxes. One place that such cross coupling may also occur is that the LNB. Particularly, satellite signals on adjacent pins of an LNB IC or otherwise on signal paths close enough to allow cross coupling may experience this effect. Accordingly, techniques can be implemented to reduce or eliminate the effects of cross coupling. FIG. 8 is a block diagram illustrating an example of cross-coupling signal cancellation in accordance with one embodiment of the technology disclosed herein. Referring now to FIG. 8, this example illustrates a portion of an LNB 400 with an LNB IC 410. LNB IC 410 can be implemented, for example, using an LNB IC such as LNB IC 310 described above. Accordingly, LNB IC 410 includes variable gain amplifiers, bandpass filters and analog-to-digital converters. LNB IC 410 can also include a CSS module (e.g. CSS 311) that can further include a module for cross-coupling signal cancellation.

In various embodiments, the cross-coupling signal cancellation module can be configured to reduce or eliminate cross coupling of the input signals that may occur in the air, in the feed horn, on the printed circuit board, in the power supply, on the IC pins, and so on. This result of this coupling, the signals at d1 and d2 may be cross contaminated in that each signal may contain some energy from the other signal. As a result of cross-coupling signal cancellation module, outputs D1, D2 can be a cleaned-up signal with cross contamination removed or suppressed.

The cross-coupling signal cancellation can be implemented using knowledge of the interfering signal. Particularly, a first of the two signals can be inverted and combined with a delayed version of the other of the two signals to cancel out (partially or completely) the interfering signal. The amount of delay is chosen such that the inverted signal aligns with the non-inverted version of that signal such that cancellation can occur. In addition, the amplitude of the inverted signal can be adjusted to adjust the level of cancellation. Adaptive filters can be used to make phase and amplitude adjustments at the appropriate frequency or frequencies.

Figure 9:
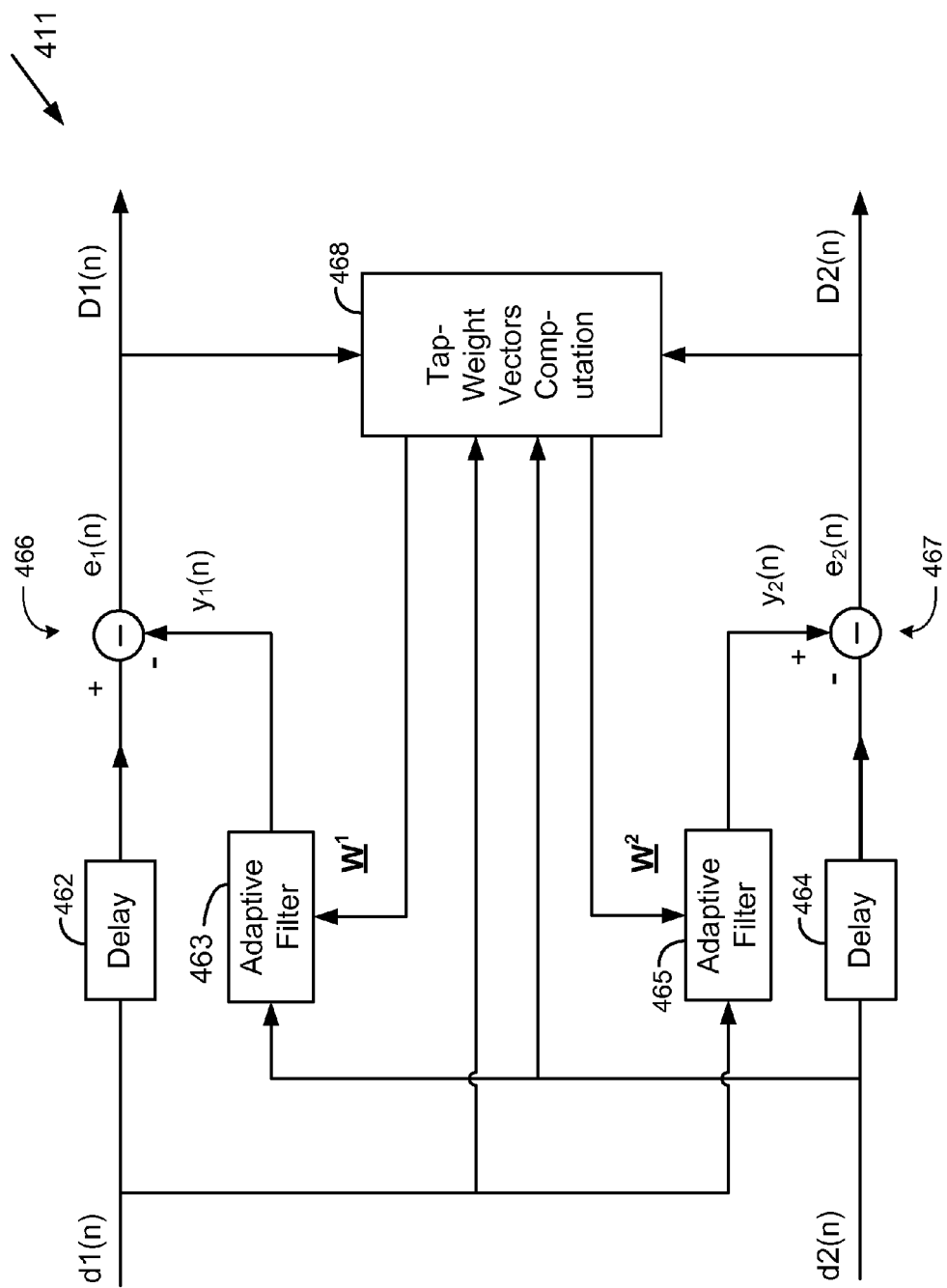
FIG. 9 is a diagram illustrating an example implementation of cross-coupling signal cancellation in accordance with one embodiment of the technology disclosed herein.

FIG. 9 is a diagram illustrating an example implementation of cross-coupling signal cancellation in accordance with one embodiment of the technology disclosed herein. Particularly, FIG. 9 illustrates an example module that can be used to implement cross-coupling signal cancellation module 411 of FIG. 8. In this example, the potentially interfering signals are designated by d1 and d2. For ease of discussion, this example will be discussed in terms of d1 being an original signal and d2 being the interfering signal. However, after reading this description, one of ordinary skill in the art will understand that either signal can interfere with the other signal. Referring now to FIG. 9, the original signal is received and delayed using delay block 462. Delay block 462 can be implemented using any of a number of conventional delay techniques including, for example, delay lines or, in digital implementations, by simply storing or holding the signal in a buffer or register. Interfering signal d2 is modified by adaptive filter 463 particularly, adaptive filter 463 inverts the interfering signal to create an inverse of the interfering signal. The phase and amplitude adjustments can be made by changing the tap weights using tap weight vector computation block 468. Then, the filtered interfering signal is subtracted from the delayed original signal using subtraction block 466. Alternatively, the interfering signal can also be inverted and added into the original signal to effectively subtract the interfering signal from the original signal.

For cross coupling of signal d1 onto signal d2, a similar process occurs, but in this instance, signal d1 is filtered using adaptive filter 465, and original signal d2 is delayed using delay module 464.

Figure 10:
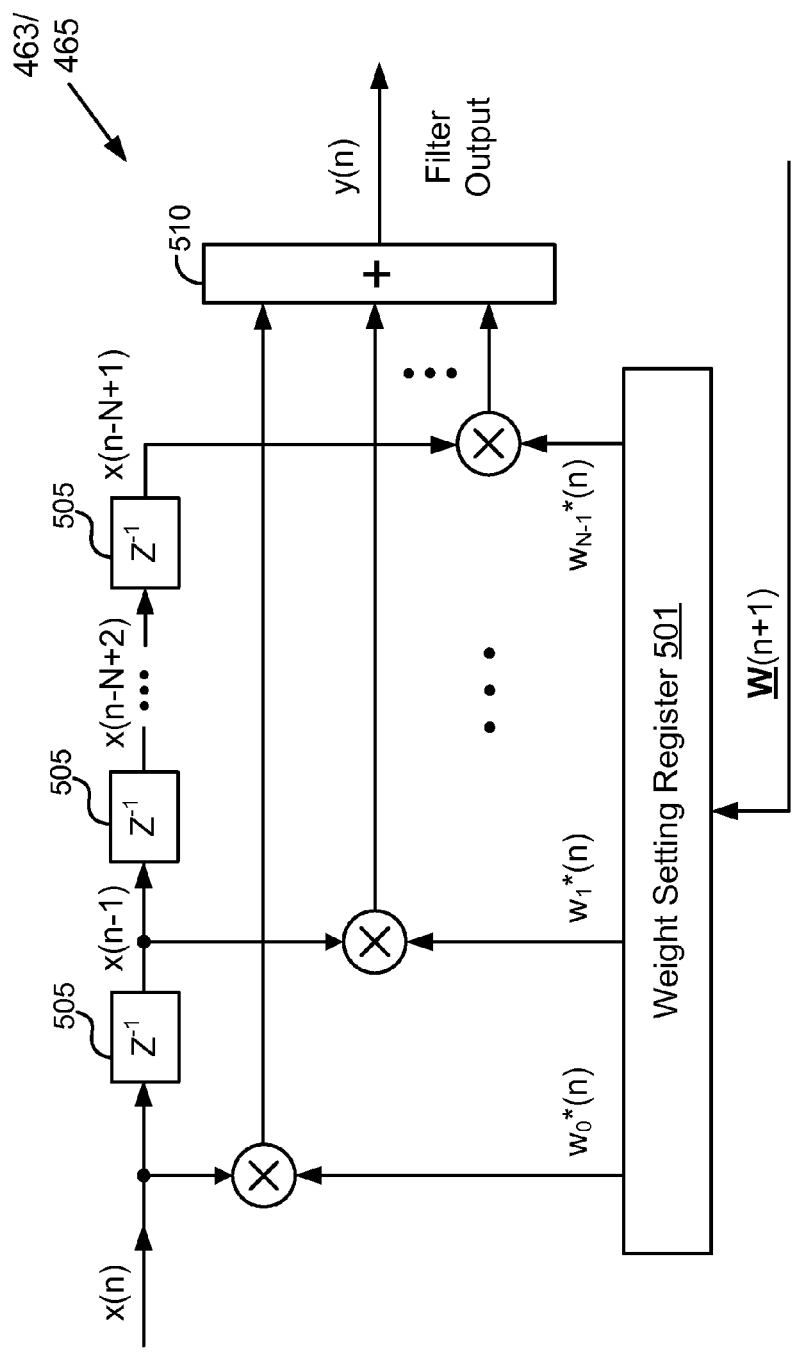
FIG. 10 is a diagram illustrating the details of an example adaptive filter.

FIG. 10 is a diagram illustrating the details of one of the adaptive filters 463, 465, for example adaptive filter 463. The $Z^{-1}$ term denotes a delay by one clock cycle T. The weight components $W^1$, $W^2$ are stored in corresponding adaptive filters 463, 465. Each TWV component $W^1$, $W^2$ is then provided by the weight setting register 501 to a plurality of weighting circuits 505 in each of the corresponding adaptive filters 463, 465. Each of the weighting circuits 505 adjusts the amount of the signal x(n) at each delay point that is to be summed together in a summing circuit 510 based on the particular value of the TWV components $W^1$, $W^2$ associated with that weighting circuit, or adaptive filter 463, 465. Accordingly, the output signal y(n) is the weighted sum of the various delays of x(n):

$$y(n) = \underline{w}_0^*(n)x(n) + \underline{w}_1^*(n)x(n-1) + \ldots + \underline{w}_{N-1}^*(n)x(n-N+1);$$

$$\underline{W}(n+1) = \underline{W}(n) + 2\mu e^*(n)\underline{x}(n);$$

where W(n+1) is the tap-weight vector next value at time n+1, the term μ is the adaptation step size and the e*(n) is the conjugate of the residue error value.

As noted above, in various embodiments cross coupling cancellation can occur for signals (e.g., signals d1, d2) on adjacent pins of the LNB IC, or for cross coupling occurs in other places up to the CSS. For pin-to-pin cancellation, the cancellation can occur for each adjacent pair of pins carrying satellite signals. In further embodiments, the cancellation can occur for all permutations of pairs of pins carrying satellite signals. In yet another embodiment, the cancellation can be implemented for pairs of pins likely to interfere with one another. To prevent potential instability and oscillatory behavior of multiple loops interfering with each other, when one loop is making adjustments, other loops are "frozen" (kept constant without making changes). After the action of the active loop is completed, another loop becomes active while others are frozen. The process continues until all loops are completed, then the maintenance cycle repeats. An additional benefit of processing one loop at the time is in reduced computational complexity, since a single computational engine can be shared between multiple loops, as opposed to the case of simultaneously processing multiple loops, when multiple computational engines would be required.

Figure 11:
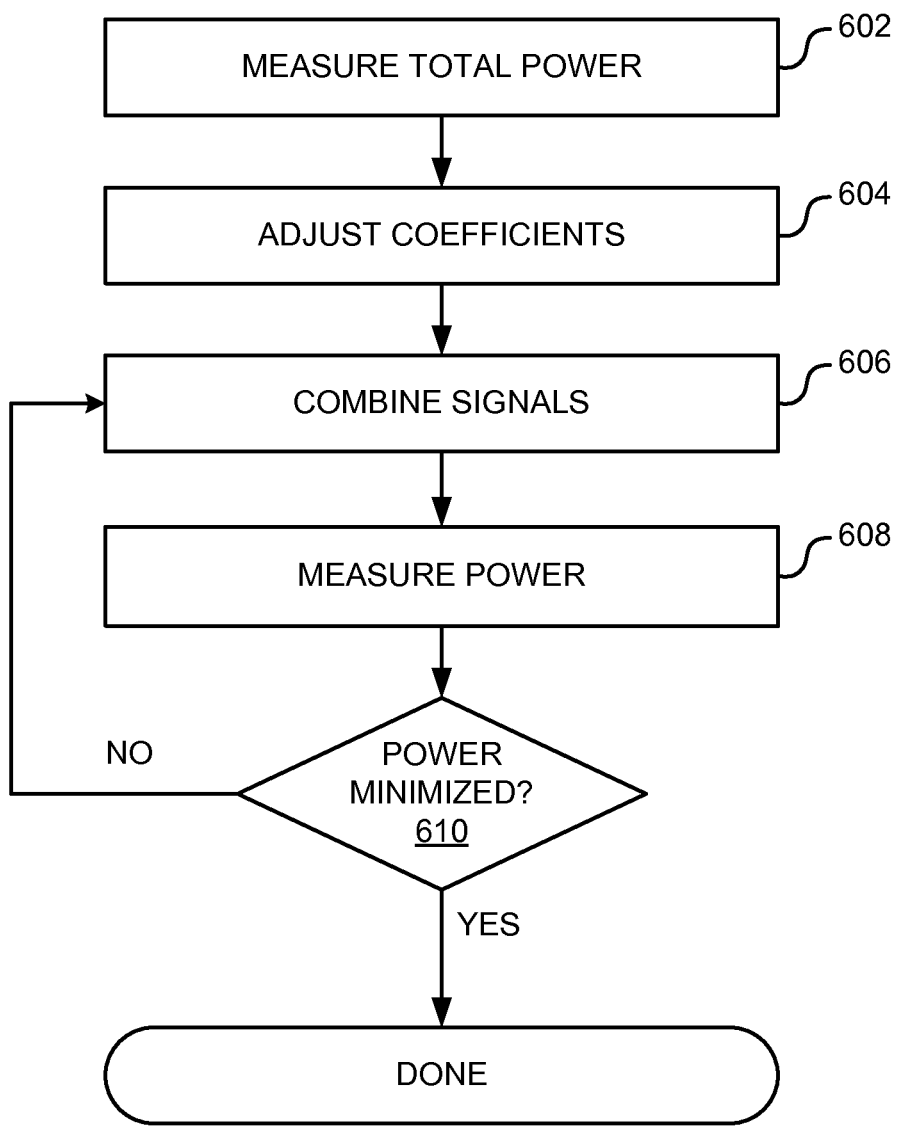
FIG. 11 is an operational flow diagram illustrating an example process for cross-coupling signal cancellation in accordance with one embodiment of the technology disclosed herein.

FIG. 11 is an operational flow diagram illustrating an example process for cross-coupling signal cancellation in accordance with one embodiment of the technology disclosed herein. In this example, the success of the cancellation, and hence the adjustment of the filter coefficients, can be made based on a measurement of the total output power. Because the output power of a given signal includes the power of the signal itself as well as the added power contributed by the cross coupled signal, when the output power is minimized (assuming all other factors remain equal, this indicates that the cross coupling is also minimized. Accordingly, an iterative least mean squares process can be implemented to adjust the filter coefficients to achieve a minimum power. This can be done on an ongoing basis, if desired, during operations.

Referring now to FIG. 11 at a step 602 the total output power is measured. In one embodiment, as illustrated by operation 604, the output power can be integrated and measured over a predefined period of time to determine the total output power. This can allow a power to be observed over a longer period of time.

At operation 604, the filter coefficients are adjusted for the interfering signal to adjust the phase and amplitude of the interfering signal. For example, in terms of the embodiment illustrated in FIG. 9, the filter coefficients of adaptive filter 463 are adjusted. At operation 606, the filtered interfering signal is combined with the original signal to cancel the cross coupled interference from the original signal. That is, the filtered interfering signal, adjusted in amplitude to approximate the amplitude of the cross coupling interference in the original signal, is subtracted from (or its inverse is added to) the original signal. The power is again measured to determine whether it is minimized. This is illustrated by operations 608 and 610. The operation continues until the power is minimized. In some embodiments, the operation continues to run in a self-adjusting fashion, maintaining the power at minimum. Where the power is at a minimum, the changes to the filter coefficients will be minimal as well, thereby holding the system approximately in a steady state.

Interference on a given satellite signal can result not only from cross coupling of one adjacent signal, but can also be affected by another adjacent signal. For example, each pin of an LNB IC generally has two adjacent neighbor pins. Accordingly, it may be desirable to cancel out cross coupling that may result from signals on these two adjacent neighbor pins. Accordingly, in some embodiments, a process similar to that described above with reference to FIG. 11 can be implemented for the signal on the subject pin and one of its adjacent neighbors. Then, once the cross coupling is minimized (e.g. the output power is minimized) the filter coefficients for the first neighbor pin are held constant and the process is repeated for the original pin and the other nearest neighbor pin. This process can be expanded to account for cross coupling onto a given pin by signals in addition to those of the adjacent pins. For example, the process may consider cross coupling effects on a given pin as a result of signals on a plurality of other pins or signal paths near enough to the subject pin to result in appreciable cross coupling.

Figure 12:
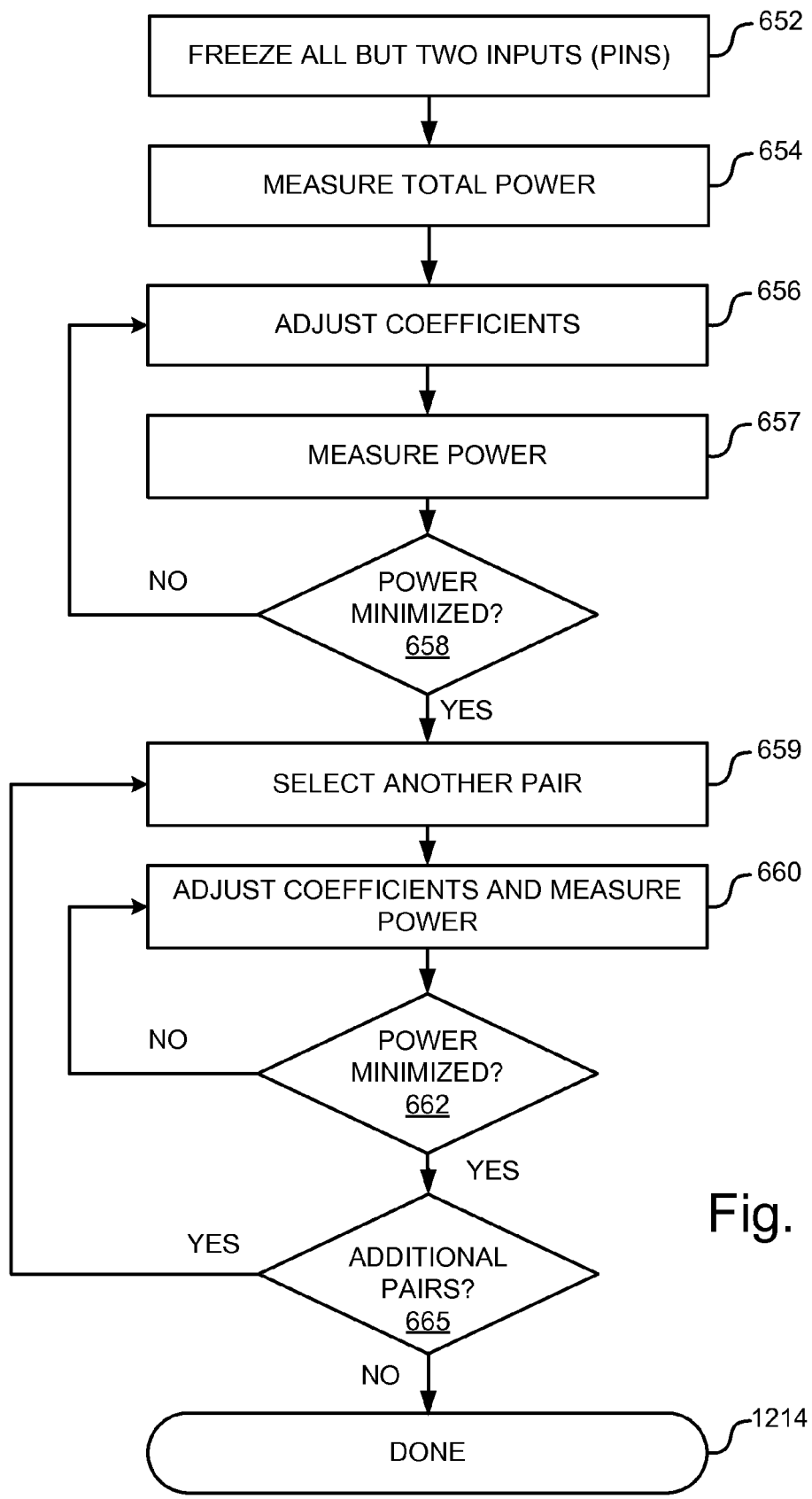
FIG. 12 is an operational flow diagram illustrating another example process for cross-coupling signal cancellation in accordance with one embodiment of the technology disclosed herein.

An example of this is illustrated in FIG. 12. Referring now to FIG. 12, as noted the process focuses on cross coupling between a given pair of pins. This can be, for example, a pair of nearest neighbor pins, or another pair of pins across which cross coupling may occur. Accordingly, any adjustments to filter coefficients for the effects caused by signals on other pins (other than the pair under immediate consideration) are held constant. This is illustrated by operation 652. As described above with reference to FIG. 11, the total output power is measured, and the filter coefficients adjusted for the interfering signal. This is illustrated at operation 654, 656. As also described above with reference to FIG. 11, the signals are combined in the power level measured to minimize the power at the output of the subject signal. This is illustrated at operations 657 and 658.

Once the cross coupling effect on a signal on a selected pin by a signal on first pin is minimized as described immediately above, the process can be repeated for a second pin. Accordingly, the filter coefficients as determined for the first pin are held constant and the filter coefficients for the second pin are adjusted to minimize the power. This is illustrated at operations 659, 660, 662. Where interference on a given pin is only addressed for that caused by two other pins (e.g. the nearest-neighbor pins) the operation may be done. However, in embodiments where interference as a result of signals on a number of different pins is being addressed, the process can repeat for each pair of pins under consideration. This is illustrated by operation 665. For example, in some embodiments, the operation can be repeated such that p pairs of satellite signals are considered, where p comprises a number of possible pairings of satellite signals in the LNB (or the number of pairings likely to give rise to appreciable interference. For example, where interference is being considered across each possible pairing of pins bearing satellite signals, the operation is performed for p pairs of satellite signals, where p is given by $n!/2(n-2)$, and where n is the number of satellite signals under consideration.

In various embodiments the amplitude of the cancellation signal is adapted to approximate the amplitude of the cross coupling signal affecting the signal under consideration. In some embodiments, convergence may occur more quickly where the filter coefficients are chosen such that the starting point for the amplitude is estimated as close as possible to the predicted level of interference caused by the cross coupling. Accordingly, parameter such as the distance between signal pairs and the frequency of the interfering signal can be taken into consideration when setting the initial filter coefficients.

As noted above, in various embodiments another feature that can be included is the ability to correct the frequency of the local oscillator, or ultimately, of the clocks used to sample the analog-to-digital converters. Embodiments of the technology disclosed herein accomplish this, in part, based on knowledge of the transponders received with the satellite signal. Because transponder characteristics such as center frequency and bandwidth are well defined, these characteristics can be used to identify the center frequency using the received signal. Generally speaking, in some embodiments, the system can be configured to receive the satellite signal with a known predefined bandwidth and a center frequency, determine the profile of the satellite signal, and compute the center frequency of the satellite signal based on the profile of the received signal. Once that is accomplished, the system can be configured to generate a reference signal at the computed center frequency.

Figure 13:
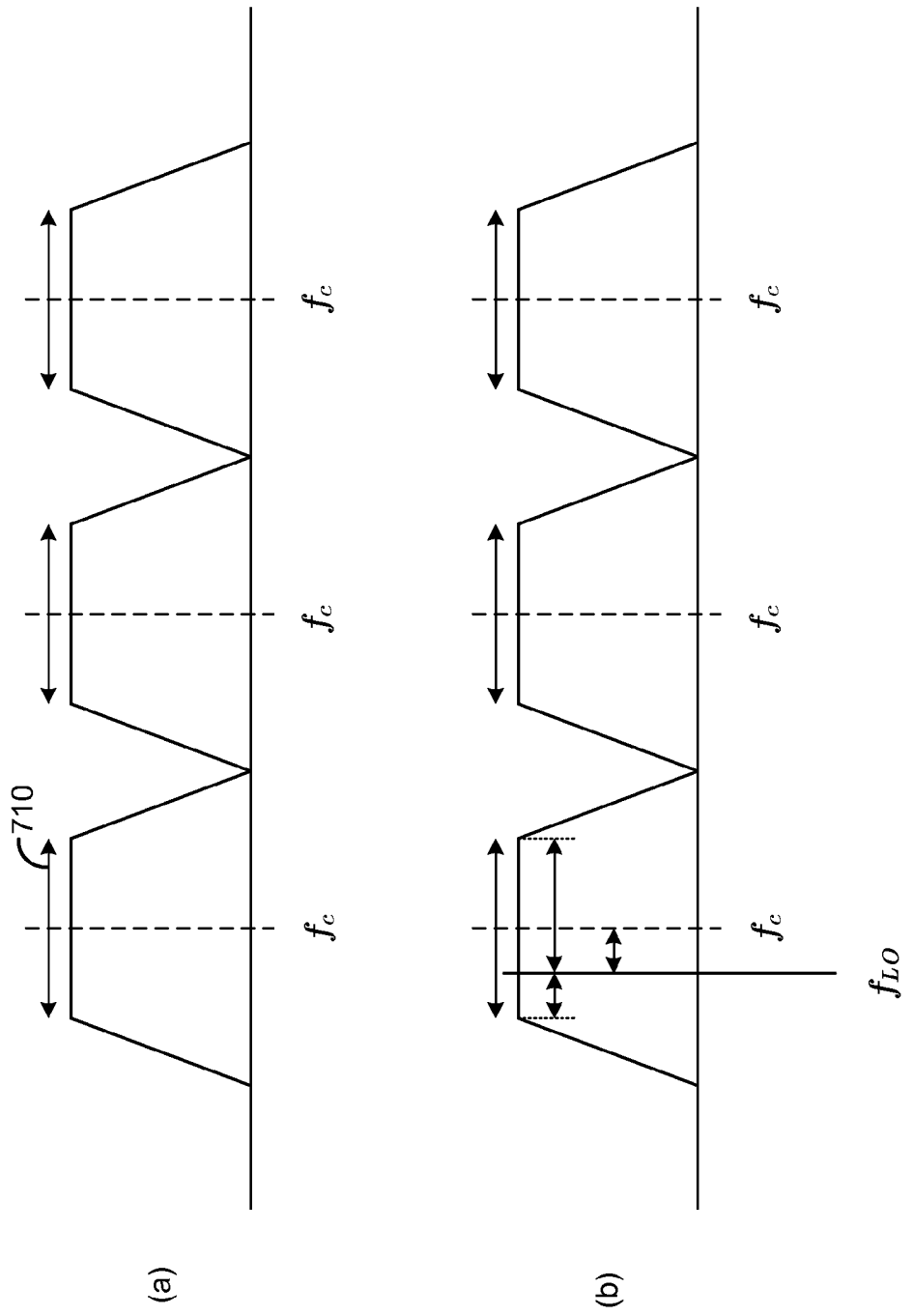
FIG. 13 is a diagram illustrating an example of three transponders received as part of a satellite signal.

FIG. 13 is a diagram illustrating an example of three transponders received as part of a satellite signal. As seen in this example at 13(a), each transponder has a center frequency, $f_c$, and a defined bandwidth 710. The spacing between the center frequencies of each transponder is known as is the bandwidth. The transponder center frequency is typically very stable, and as such can be used as a reference for the local oscillator frequency. The oscillator may have an inaccurate frequency due to component tolerances, as well as its frequency can drift as a result of temperature variations or instability over time and aging. As a result of the tolerance and drift, local oscillator frequency, fw, is offset from transponder center frequency, $f_c$, by an unknown amount. Therefore, the known spectral shape of the transponder can be used to identify the center frequency.

Figure 14:
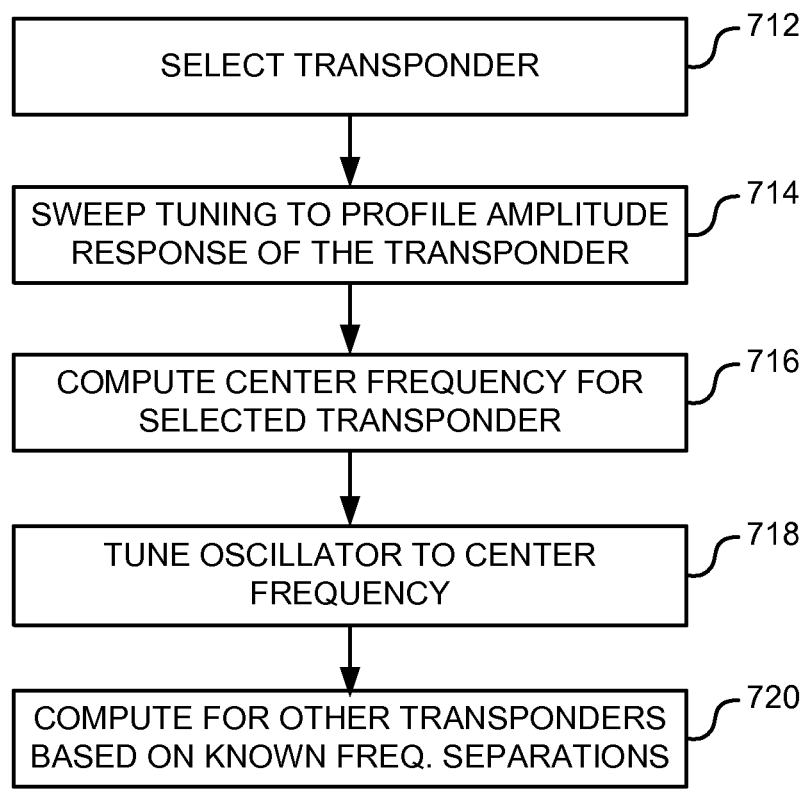
FIG. 14 is a diagram illustrating an example process for adjusting the oscillator frequency to correct for changes in the center channel frequency in accordance with one embodiment of the technology disclosed herein.

FIG. 14 is a diagram illustrating an example process for adjusting the oscillator frequency to correct for changes in the center channel frequency in accordance with one embodiment of the technology disclosed herein. With reference now to FIG. 14 at operation 712, a transponder is selected. At operation 714, the tuning for that transponder is swept above and below the reference frequency generated directly or indirectly by the oscillator. This is, for example, the estimated center channel frequency for the transponder. A purpose of sweeping above and below the reference frequency is to profile the amplitude response of the transponder. For example, the system can be configured to determine the upper and lower rolloff points of the received transponder signal based on, for example, measured signal strength. Because the center frequency is midway between the upper and lower rolloff points, the center frequency can be determined based on this profiling. This is illustrated by operation 716. At operation 718, the oscillator can be tuned to the center frequency, or otherwise adjusted such that derivatives thereof (e.g., generated by frequency multipliers or dividers) will be at or substantially at a center frequency of the transponder. For example, a varactor may be used to tune the oscillator or, capacitors and a bank of capacitors can be switched in or out of the circuit to tune the operating frequency.

Alternatively, the LO frequency is not tuned to the correct center frequency, rather the frequency error is computed and digitally applied and proportionally corrected in all stages that need to have accurate frequency. For example the output frequency at the output of the DAC is proportionally offset to the correct value, while the DAC clock itself is still uncorrected. Accordingly, in such embodiments, implementations can be accomplished in which no physical tuning elements are needed, and the correction is accomplished computationally.

Once the center frequency of a given transponder is determined, the center frequencies of the other transponders can be determined based on the known spacing between transponder center frequencies. This is illustrated at operation 720. Although it may be easier to calculate the center frequencies or other transponders based on known separations, in other embodiments, the process described above for sweeping and profiling transponders can be repeated for each transponder.

In one embodiment, to avoid transponder ambiguity, the outer transponders (i.e. the first or the last transponder in the band) are chosen for the above calibration process. In another embodiment, when the LO frequency $f_{LO}$ has an error less than half transponder width, any transponder can be used for calibration.

In another embodiment, rather than profiling based on rolloff points, the system can be configured to measure the signal strength during the sweeping operation and determine spectral nulls of one or more transponder signals. Once the spectral nulls, or minimum power points in the spectrum, are identified the center frequency can again be determined, for example, as the midpoint between the spectral nulls.

In various embodiments, centering of the LO frequency for WiFi system may be accomplished in a similar manner as described above for satellite implementations. In the case of WiFi implementations, the channel profiles used for the frequency sweep and analysis are those as specified for WiFi channels as opposed to the satellite transponder profiles.

Another feature as noted above that can be included in various embodiments of the technology disclosed herein includes a dielectric oscillator to provide the clock frequencies used at least for sampling by the analog-to-digital converters and digital-to-analog converters. The clock can be provided directly by the oscillator or through multiplier or divider circuits to provide the desired clock rate. In some embodiments, the oscillator can be configured as a dielectric resonator oscillator (DRO). A dielectric resonator typically comprises a dielectric material (e.g., ceramic or other dielectric) that relies on a change in permittivity at its surface to confine electromagnetic waves for resonance. That is, standing waves can be created within the dielectric material. In various embodiments, the dielectric resonator is a cylindrical material sometimes referred to as a "puck." Preferably, the puck has a large dielectric constant and a relatively low dissipation factor. The dimensions of the resonator, or puck, are chosen based on the desired resonant frequency. The dielectric resonator provides frequency stabilization at the resonant frequency and typically allows a high Q. The DRO is achieved by combining resonating elements (L, C or R) coupled to an active device such as, for example, a transistor. The feedback element can be included to reflect the standing wave within the resonating element.

Figure 15:
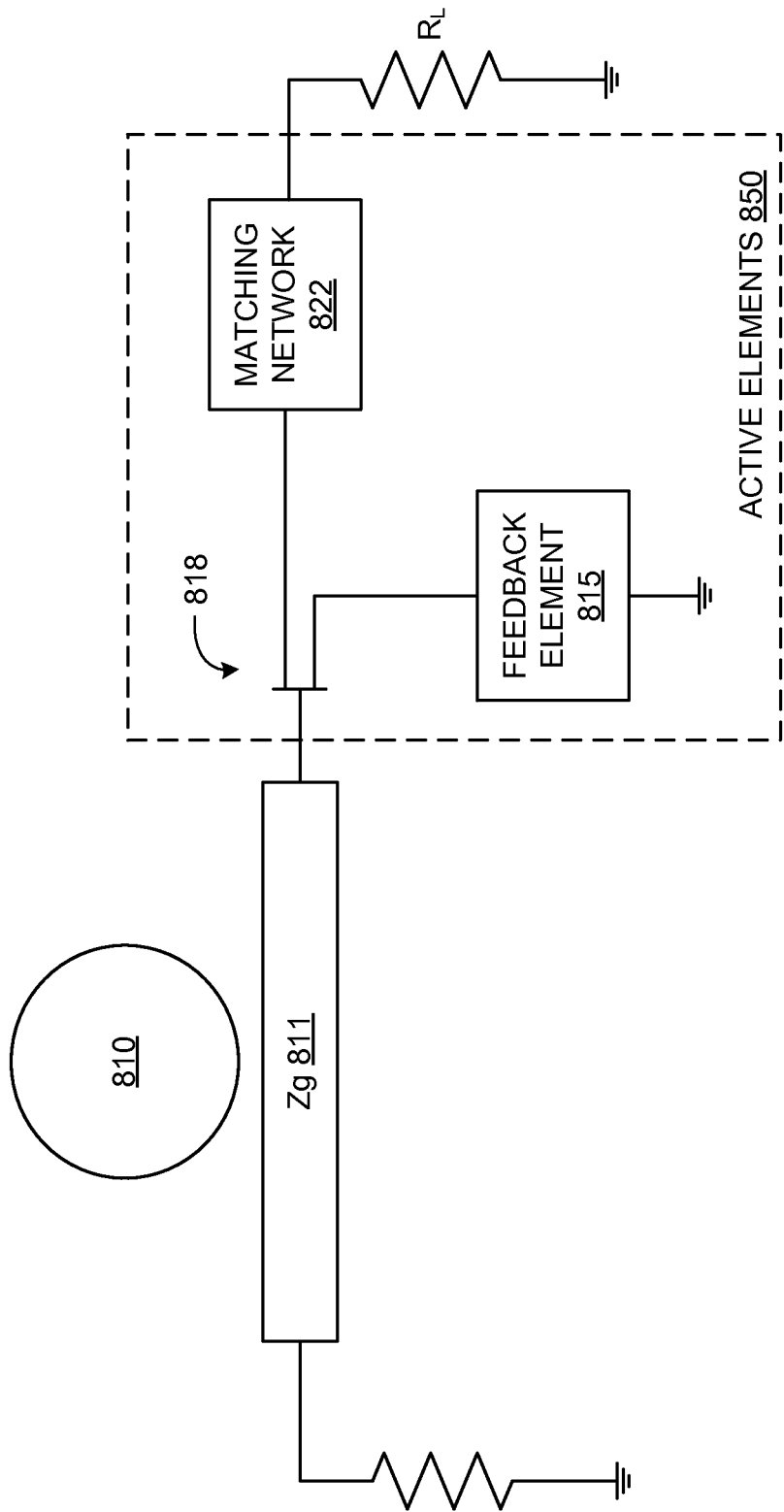
FIG. 15 is a diagram illustrating an example of a DRO in accordance with one embodiment of the technology disclosed herein.

FIG. 15 is a diagram illustrating an example of a DRO in accordance with one embodiment of the technology disclosed herein. Referring now to FIG. 15, this example includes a dielectric resonator 810, a transmission line 811, a feedback element 815, and a matching network 822. In various embodiments, feedback element 815 and matching network 822 may be referred to as active elements 850. Active elements 850 may also include transistor 818. Transistor 818 may include, for example, a Si-bipolar transistor, GaAs FET, or CMOS transistor.

In operation, a signal is input on transmission line 811. Transmission line 811 can be, for example, a microstrip transmission line. Transmission line 811 is ideally configured as having a length at a quarter wavelength (or integer multiples thereof) of the desired resonant frequency. Dielectric resonator 810 can, for example, be configured as a dielectric puck made of a dielectric material such as, for example, ceramic, porcelain, glass, plastic, or polymer materials having dielectric properties. Feedback element 815 can be provided to reflect the signal back onto transmission line 811 for resonance. Matching network 822 can be included to match the resonator to the load (represented in this example by resistor RD.

Figure 16:
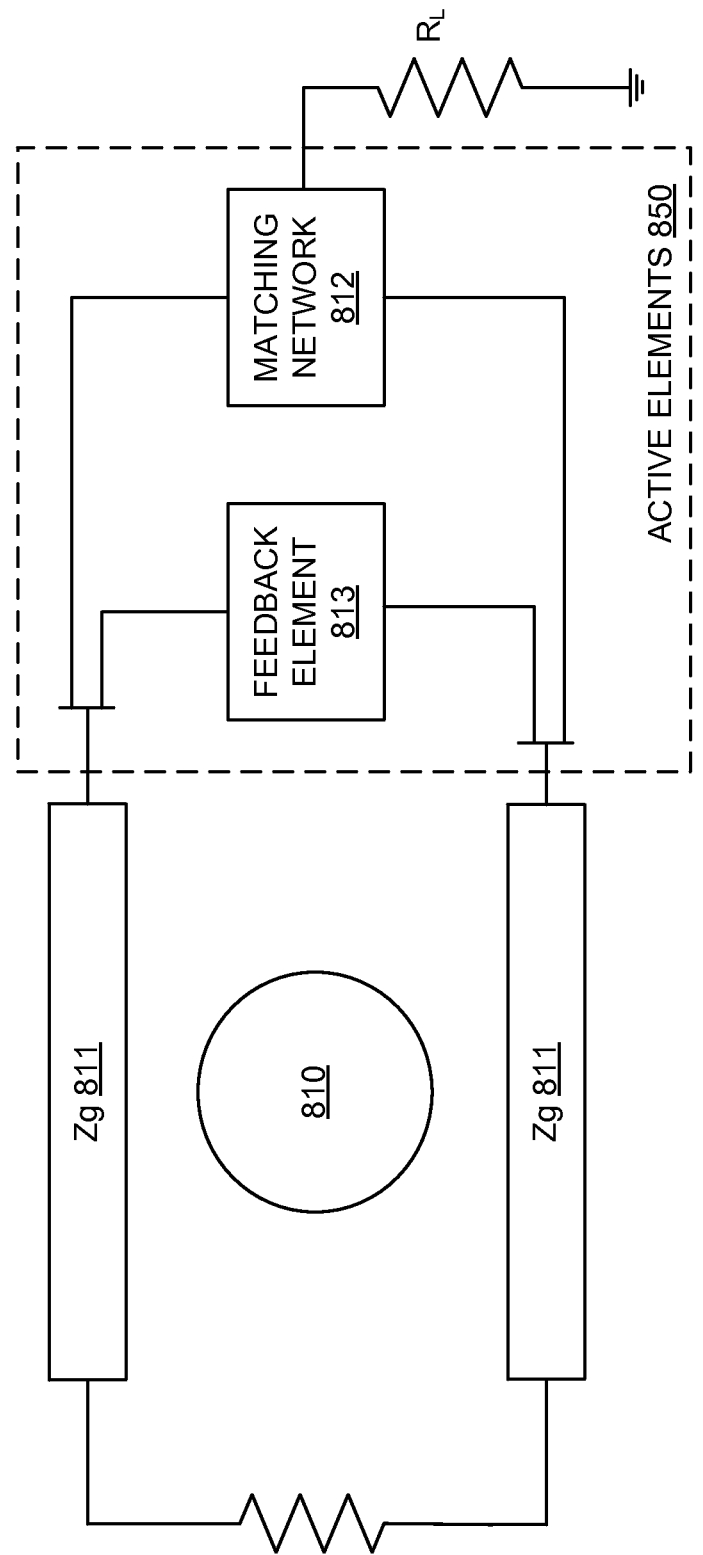
FIG. 16 is a diagram illustrating another example of a dielectric resonator oscillator that may be implemented in accordance with various embodiments of the technology disclosed herein.

FIG. 16 is a diagram illustrating another example of a dielectric resonator oscillator that may be implemented in accordance with various embodiments of the technology disclosed herein. In the example illustrated in FIG. 16, two transmission lines 811 are provided to form a resonant circuit along with the dielectric resonator 810 and feedback element 813. In another example, the resistor between the two transmission lines 811 is removed, leaving the lines open-circuited.

Figure 17:
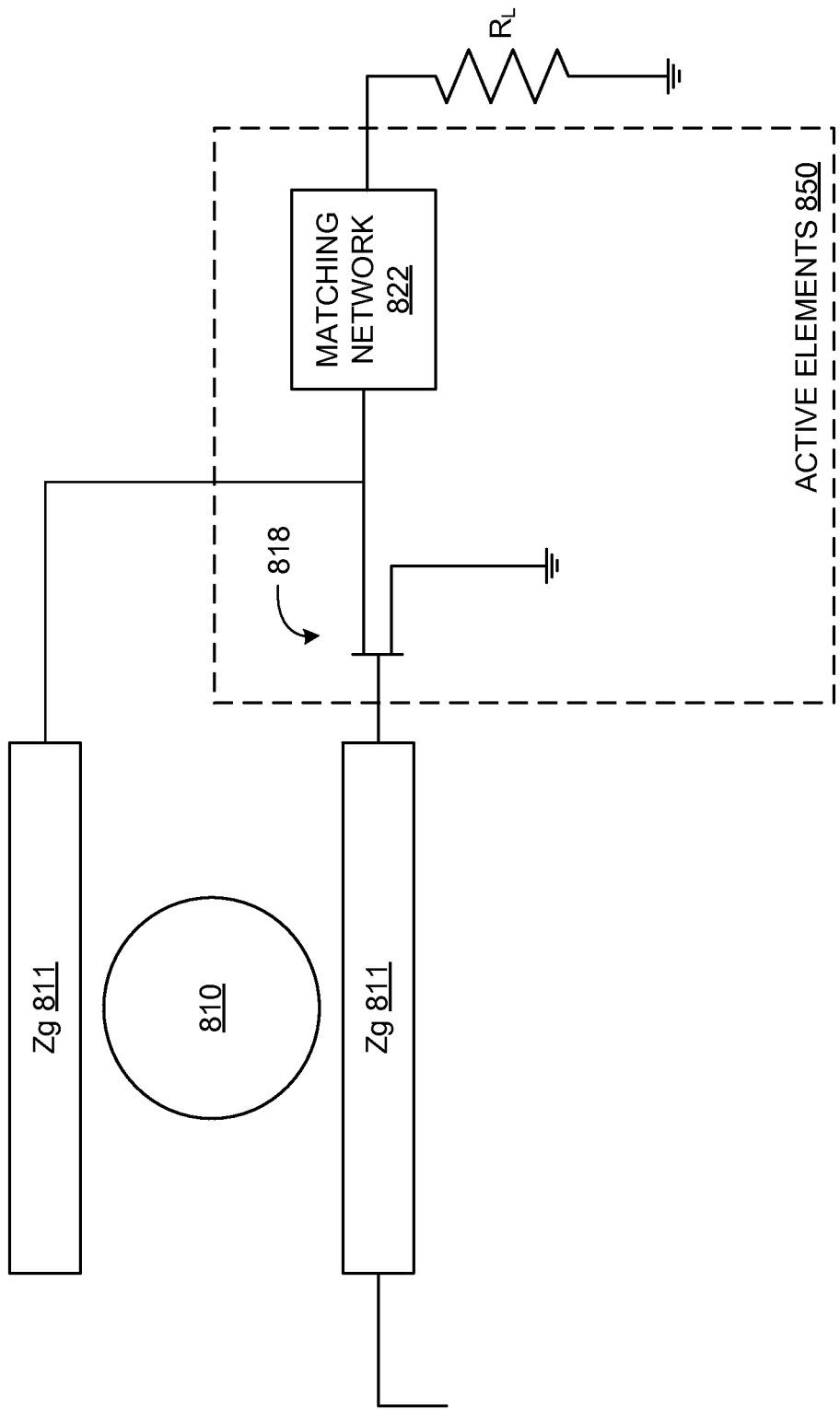
FIG. 17 is a diagram illustrating another example of a dielectric resonator oscillator that may be implemented in accordance with various embodiments of the technology disclosed herein.

FIG. 17 is a diagram illustrating another example of a dielectric resonator oscillator that may be implemented in accordance with various embodiments of the technology disclosed herein. In this example, the two transmission lines 811 are open, unterminated on the input side.

Figure 18:
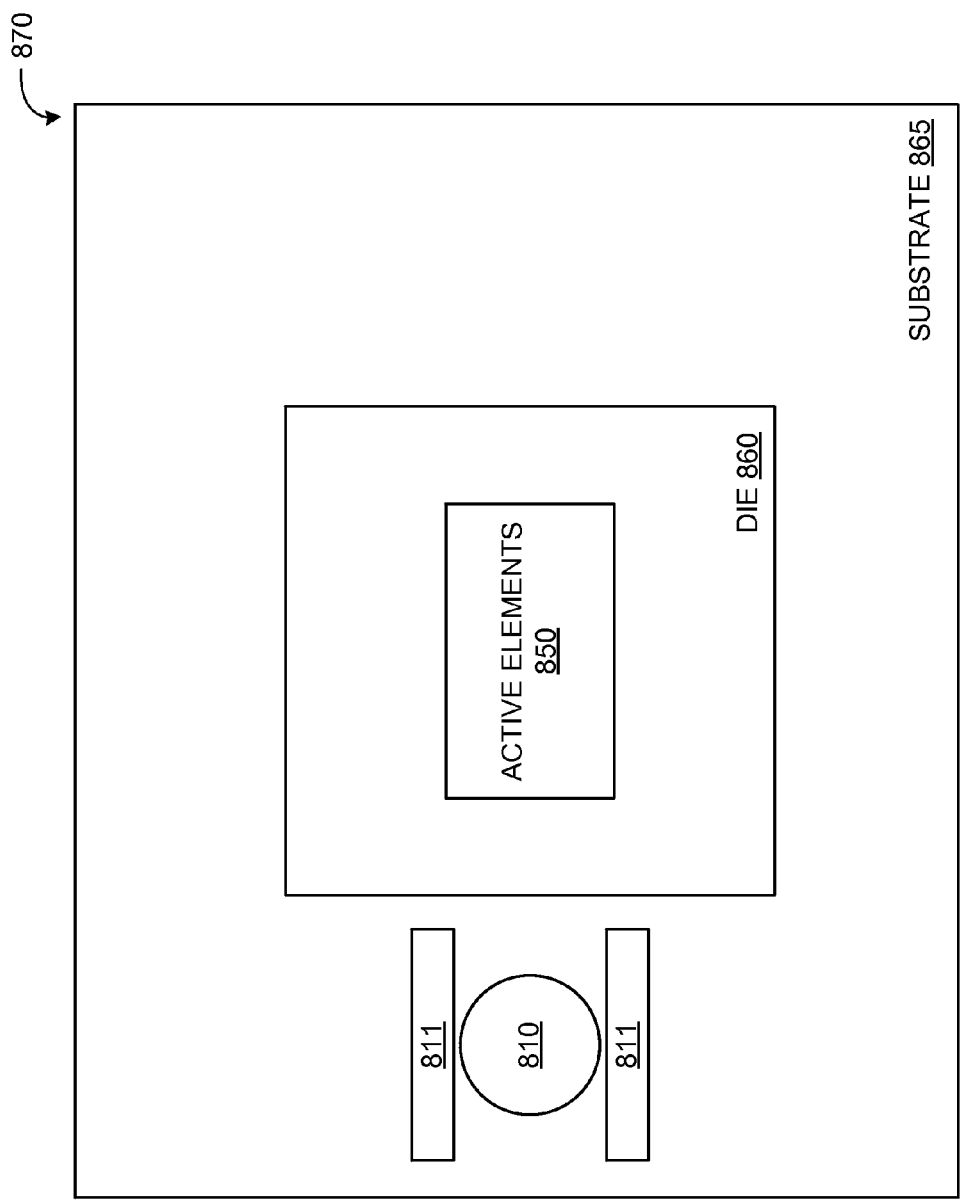
FIG. 18 is a diagram illustrating an example implementation of an integrated DRO in accordance with one embodiment of the technology disclosed herein.

In various embodiments, advantages can be obtained where the dielectric resonator oscillator is integrated as part of the IC package. For example, in some embodiments some or all of the active elements can be included in the die of the LNB IC. The passive components (e.g., the dielectric resonator 810 in one or more transmission lines 811) may be mounted in close proximity to the die such as on the printed circuit board or, on the substrate of the integrated circuit package where the integrated circuit package is a flip chip package. FIG. 18 is a diagram illustrating an example implementation of an integrated DRO in accordance with one embodiment of the technology disclosed herein. With reference now to FIG. 18, illustrated in this example is the general configuration of a flip chip package 870 including a substrate 865 and a die 860. As this example illustrates active elements 850 of the DRO can be integrated as part of the die. That is, they can be fabricated along with the other circuitry that makes up the LNB IC. As this example also illustrates, dielectric resonator 810 and one or more transmission lines 811 can be included on the substrate 865 of the LNB IC (e.g., flip chip 870). For clarity of illustration, the interconnects between the components mounted on the substrate and active elements 850 are not illustrated in this example. However, the electrical interconnects are schematically represented in FIGS. 15, 16, and 18, and given this description, one of ordinary skill in the art will understand how to interconnect one or more transmission lines 811 within input and with active elements 850.

Figure 19:
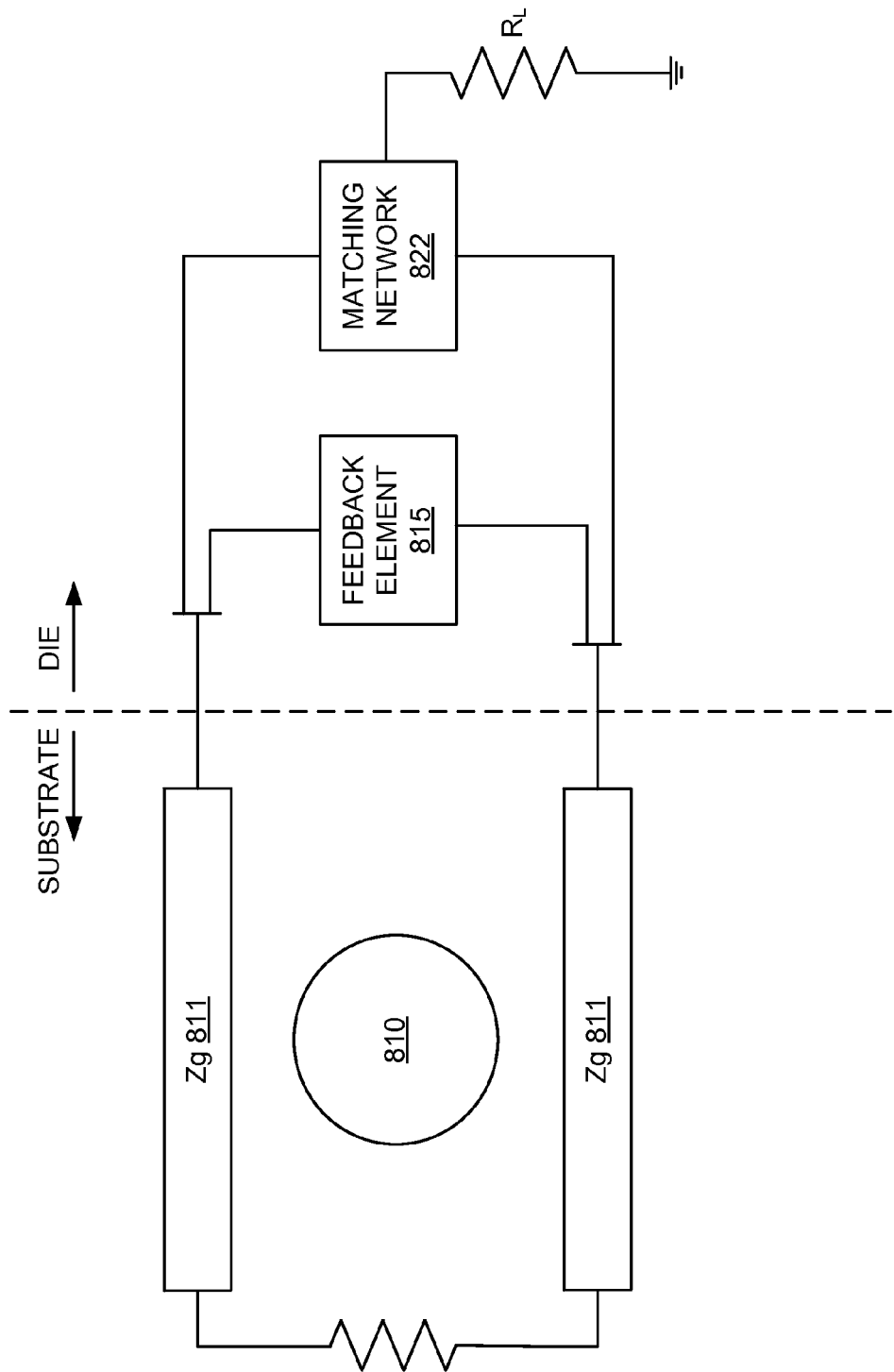
FIG. 19 is another diagram illustrating the inclusion of active elements of the dielectric resonator oscillator on a die and passive elements on the substrate.

FIG. 19 is another diagram illustrating the inclusion of active elements of the dielectric resonator oscillator on a die and passive elements on the substrate. Although not illustrated in FIG. 19, in another embodiment dielectric resonator, or puck, 810 can be mounted on the printed circuit board adjacent the semiconductor package. In such an embodiment, the one or more transmission lines 811 would be configured as having sufficient length to run from a position adjacent the dielectric resonator 810 to the substrate of the integrated circuit package.

Figure 20:
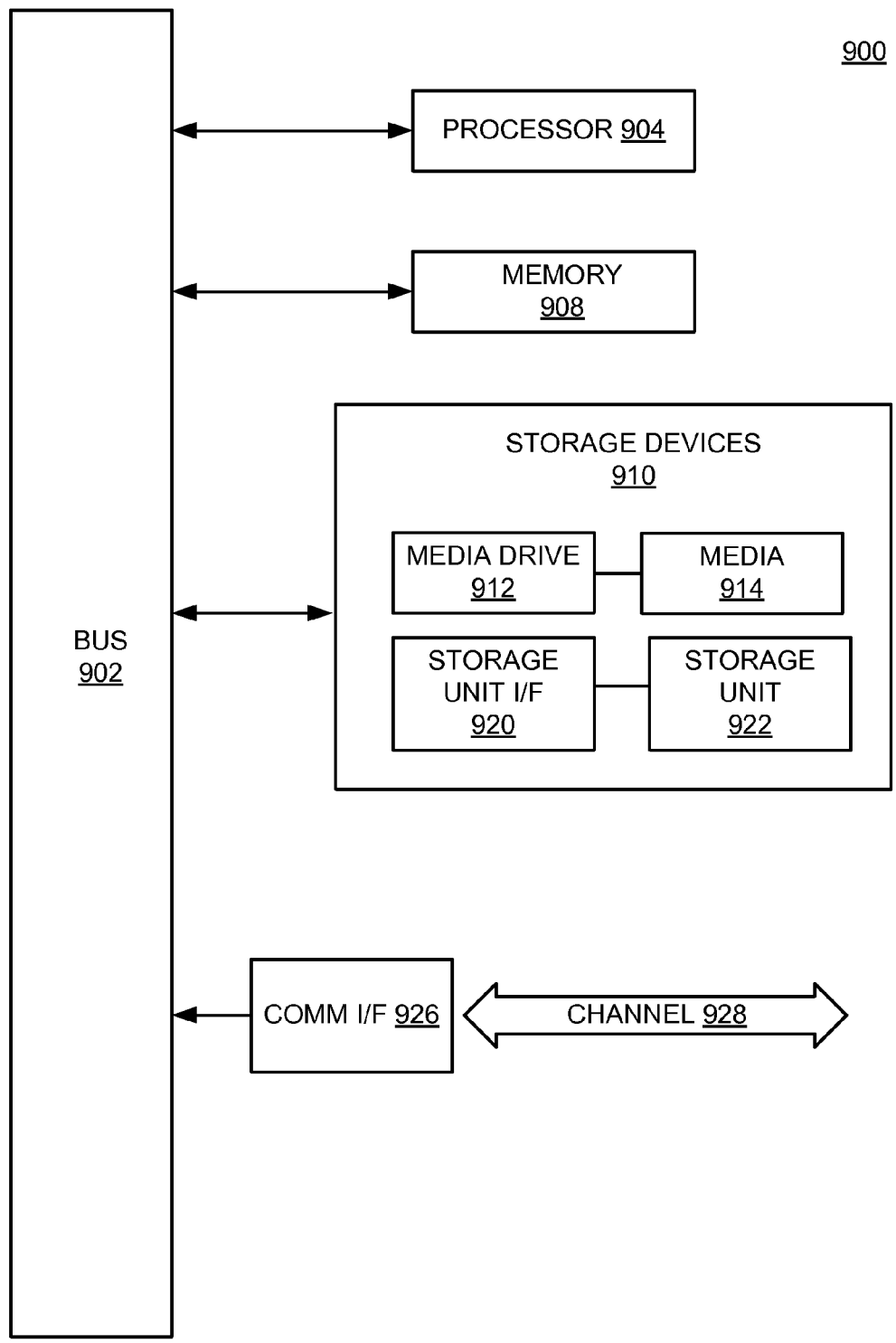
FIG. 20 is a diagram illustrating an example computing module which can be used in accordance with various embodiments of the technology described herein.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 20. Various embodiments are described in terms of this example-computing module 900. After reading this description, it will become apparent to a person skilled in the relevant art how to implement the technology using other computing modules or architectures.

Referring now to FIG. 20, computing module 900 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 900 might include, for example, one or more processors, controllers, control modules, or other processing devices, such as a processor 904. Processor 904 might be implemented using a general-purpose or special-purpose processing engine such as, for example, a microprocessor, controller, or other control logic. In the illustrated example, processor 904 is connected to a bus 902, although any communication medium can be used to facilitate interaction with other components of computing module 900 or to communicate externally.

Computing module 900 might also include one or more memory modules, simply referred to herein as main memory 908. For example, preferably random access memory (RAM) or other dynamic memory, might be used for storing information and instructions to be executed by processor 904. Main memory 908 might also be used for storing temporary variables or other intermediate information during execution of instructions to be executed by processor 904. Computing module 900 might likewise include a read only memory ("ROM") or other static storage device coupled to bus 902 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive might be provided. Accordingly, storage media 914 might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and a storage unit interface 920. Examples of such storage units 922 and a storage unit interfaces 920 can include a program cartridge and cartridge interface, a removable memory (for example, a flash memory or other removable memory module) and memory slot, a PCMCIA slot and card, and other fixed or removable storage units 922 and a storage unit interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 924 might typically be carried on signals, which can be electronic, electromagnetic (which includes optical) or other signals capable of being exchanged by a given communications interface 924. These signals might be provided to communications interface 924 via a channel 928. This channel 928 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 922, media 914, and channel 928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A circuit for frequency sampling using an integrated dielectric resonator oscillator (DRO), comprising:
   a first input coupled to receive a first satellite signal at a first satellite downlink frequency;
   a second input coupled to receive a second satellite signal at a second satellite downlink frequency;
   a first analog-to-digital converter having an input coupled to receive the first satellite signal and an output, the first analog-to-digital converter configured to operate at a sampling rate at least twice the first satellite downlink frequency, and further configured to create a first digital output signal representing the first satellite signal;
   a second analog-to-digital converter having an input coupled to receive the second satellite signal and an output, the second analog-to-digital converter configured to operate at a sampling rate at least twice the second satellite downlink frequency, and further configured to create a second digital output representing the second satellite signal;
   a dielectric resonator oscillator having an output; and
   a clock generator circuit having an input coupled to the oscillator output and configured to output one or more clocks used by the first and second analog-to-digital converters;
   wherein the first and second analog-to-digital converters are implemented as part of an integrated circuit and a resonator element of the dielectric resonator oscillator is mounted on the substrate of the integrated circuit.

2. The frequency sampling circuit of claim 1, wherein the integrated circuit comprises a flip-chip IC, the flip-chip IC comprising a substrate and a die.

3. The frequency sampling circuit of claim 2, wherein the dielectric resonator oscillator comprises:
   a dielectric resonator;
   a transmission line disposed on the substrate of the flip chip and extending adjacent the dielectric resonator; and
   active elements coupled to the transmission line and integrated with the die of the flip chip.

4. The frequency sampling circuit of claim 3, wherein the active elements comprise:
- an active device having an input electrically connected to the transmission line; and
- a matching network having an input electrically connected to an output of the active device and an output configured to be connected to a load.

5. The frequency sampling circuit of claim 3, wherein the dielectric resonator is mounted on the substrate of the flip-chip IC.

6. The frequency sampling circuit of claim 3, wherein the flip-chip IC is mounted on a printed circuit board and the dielectric resonator is mounted on the printed circuit board adjacent the flip-chip IC.

7. The frequency sampling circuit of claim 6, wherein the transmission line disposed on the substrate of the flip chip and extending adjacent the dielectric resonator extends to the printed circuit board adjacent the dielectric resonator.

8. The frequency sampling circuit of claim 3, wherein the dielectric resonator comprises dielectric material configured as a cylindrical disk.

9. The frequency sampling circuit of claim 2, wherein the transmission line is positioned sufficiently close to the dielectric resonator to form part of a resonant circuit with the dielectric resonator.

10. The frequency sampling circuit of claim 2, wherein the clock generator circuit comprises at least one of a frequency multiplier and an frequency divider to provide the one or more clocks used by the first and second analog-to-digital converters at frequencies different from that output by the dielectric resonator oscillator.

11. A dielectric resonator oscillator, comprising:
- a dielectric resonator;
- a transmission line disposed adjacent the dielectric resonator;
- an active device having an input electrically connected to the transmission line;
- a matching network having an input electrically connected to an output of the active device and an output configured to be connected to a load; and
- wherein both the transmission line and the active device are positioned sufficiently close to the dielectric resonator to form part of a resonant circuit with the dielectric resonator.

12. The dielectric resonator oscillator of claim 11, wherein the dielectric resonator is disposed directly on a substrate of a flip chip.

13. The dielectric resonator oscillator of claim 11, wherein the dielectric resonator is coupled to the transmission line and the active device without a direct connection.

14. The dielectric resonator oscillator of claim 11, further comprising a second transmission line disposed adjacent the dielectric resonator.

15. The dielectric resonator oscillator of claim 11, wherein the active device comprises a Si-bipolar transistor, GaAs FET, or CMOS transistor.

16. The dielectric resonator oscillator of claim 11, wherein the transmission line is a microstrip line, and the dielectric resonator is coupled to the transmission line and the active device without a direct connection.

17. A dielectric resonator oscillator integrated with a flip-chip IC comprising a substrate and a die, the dielectric resonator oscillator comprising:
- a dielectric resonator;
- a transmission line disposed on the substrate of the flip chip and extending adjacent the dielectric resonator; and
- an active device integrated with the die of the flip chip and having an input electrically connected to the transmission line;
- wherein the transmission line is positioned sufficiently close to the dielectric resonator to form part of a resonant circuit with the dielectric resonator.

18. The dielectric resonator oscillator of claim 17, further comprising a matching network integrated with the die of the flip chip having an input electrically connected to an output of the active device and an output configured to be connected to a load.

19. The dielectric resonator oscillator of claim 17, wherein the dielectric resonator is mounted on the substrate of the flip-chip IC.

20. The dielectric resonator oscillator of claim 17, wherein the flip-chip IC is mounted on a printed circuit board and the dielectric resonator is mounted on the printed circuit board adjacent the flip-chip IC.

21. The dielectric resonator oscillator of claim 20, wherein the transmission line disposed on the substrate of the flip chip and extending adjacent the dielectric resonator extends to the printed circuit board adjacent the dielectric resonator.

22. The dielectric resonator oscillator of claim 17, wherein the dielectric resonator comprises dielectric material configured as a cylindrical disk.

* * * * *